US011012080B2

(12) United States Patent
Wei et al.

(10) Patent No.: US 11,012,080 B2
(45) Date of Patent: May 18, 2021

(54) FREQUENCY LOCKED LOOP, ELECTRONIC DEVICE, AND FREQUENCY GENERATION METHOD

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Xiangye Wei, Beijing (CN); Liming Xiu, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,287

(22) PCT Filed: Jan. 2, 2019

(86) PCT No.: PCT/CN2019/070131
§ 371 (c)(1),
(2) Date: Jan. 23, 2020

(87) PCT Pub. No.: WO2020/140206
PCT Pub. Date: Jul. 9, 2020

(65) Prior Publication Data
US 2021/0075431 A1     Mar. 11, 2021

(51) Int. Cl.
*H03L 7/099*     (2006.01)
*H03L 7/091*     (2006.01)
*H03L 7/18*      (2006.01)

(52) U.S. Cl.
CPC ............ *H03L 7/0992* (2013.01); *H03L 7/091* (2013.01); *H03L 7/0991* (2013.01); *H03L 7/18* (2013.01)

(58) Field of Classification Search
CPC ......... H03L 7/0992; H03L 7/091; H03L 7/18; H03L 7/0994; H03L 7/085; H03L 7/08; H03L 7/095; H03L 7/099; H03L 7/0991
See application file for complete search history.

(56) References Cited

U.S. PATENT DOCUMENTS

| | | | | |
|---|---|---|---|---|
| 6,404,247 B1 * | 6/2002 | Wang | ............... | H03L 7/0814 327/105 |
| 7,256,656 B2 * | 8/2007 | Wu | ............... | H03L 7/093 327/160 |

(Continued)

FOREIGN PATENT DOCUMENTS

| | | |
|---|---|---|
| CN | 108270437 A | 7/2018 |
| CN | 109031361 A | 12/2018 |

*Primary Examiner* — Jung Kim
(74) *Attorney, Agent, or Firm* — Dilworth & Barrese, LLP.; Michael J. Musella, Esq.

(57) ABSTRACT

A frequency locked loop, an electronic device, and a frequency generation method are provided. The frequency locked loop includes: a control circuit, configured to judge a size relationship between an input frequency and a feedback frequency to obtain a control signal, and determine a frequency control word according to the control signal, in which the control signal includes a first sub-control signal and a second sub-control signal, the control circuit is configured to generate the first sub-control signal in a case where the input frequency is greater than the feedback frequency, and the control circuit is configured to generate the second sub-control signal different from the first sub-control signal in a case where the input frequency is less than the feedback frequency; and a digital control oscillation circuit, configured to generate and output an output signal having a target frequency according to the frequency control word.

18 Claims, 12 Drawing Sheets

(56) References Cited

U.S. PATENT DOCUMENTS

| | | |
|---|---|---|
| 2005/0108600 A1 | 5/2005 | Arguelles |
| 2014/0093015 A1 | 4/2014 | Xiu |
| 2019/0123749 A1 | 4/2019 | Xiu |

* cited by examiner

US 11,012,080 B2

FREQUENCY LOCKED LOOP, ELECTRONIC DEVICE, AND FREQUENCY GENERATION METHOD

TECHNICAL FIELD

Embodiments of the present disclosure relate to a frequency locked loop, an electronic device, and a frequency generation method.

BACKGROUND

With a rapid development of industry and a rapid popularization of Internet of Things, intelligent devices need to have the characteristics of low power consumption. In the intelligent devices, an integrated circuit intelligent chip can control and process all electronic information. In the integrated circuit intelligent chip, clock signals are used to drive and coordinate the activities of various electronic devices. A reliable clock processing unit is indispensable for the work of the integrated circuit intelligent chip.

At present, phase locked loops are the most widely used clock processing unit in electronic chips. According to design types, the phase locked loops can be divided into an analog phase locked loop, a digital phase locked loop, and a digital-analog hybrid phase locked loop. The analog phase locked loop has the characteristics, such as high precision, fast response, and the like, but the analog phase locked loop has a large circuit volume, a high cost, a long research and development period, and not being easy to be transplanted. A voltage controlled oscillator is difficult to be made into a digital form, so the phase locked loops need to include analog circuits. Based on this case, the digital-to-analog hybrid phase locked loop is currently most widely used. In the digital-analog hybrid phase locked loop, the voltage controlled oscillator takes the form of an analog circuit, while a phase detector, a loop filter, a frequency divider, and other components take the form of digital circuits, which is beneficial to control the circuit and reduce the size of the circuit.

SUMMARY

At least one embodiment of the present disclosure provides a frequency locked loop, comprising: a control circuit, configured to judge a size relationship between an input frequency and a feedback frequency to obtain a control signal, and determine a frequency control word according to the control signal, in which the control signal comprises a first sub-control signal and a second sub-control signal, the control circuit is configured to generate the first sub-control signal in a case where the input frequency is greater than the feedback frequency, and the control circuit is configured to generate the second sub-control signal that is different from the first sub-control signal in a case where the input frequency is less than the feedback frequency; and a digital control oscillation circuit, configured to generate and output an output signal having a target frequency according to the frequency control word.

For example, in the frequency locked loop provided by at least one embodiment of the present disclosure, the control circuit comprises a frequency detector and a signal generation sub-circuit, the frequency detector is configured to judge a size relationship between the input frequency and the feedback frequency to obtain the control signal, the frequency detector is configured to generate and output the first sub-control signal in a case where the input frequency is greater than the feedback frequency, and the frequency detector is configured to generate and output the second sub-control signal in a case where the input frequency is less than the feedback frequency; and the signal generation sub-circuit is configured to generate the frequency control word according to the control signal and output the frequency control word to the digital control oscillation circuit under control of a clock signal, the clock signal is the output signal or a feedback signal having the feedback frequency.

For example, in the frequency locked loop provided by at least one embodiment of the present disclosure, the signal generation sub-circuit is configured to, according to the first sub-control signal, subtract a first adjustment parameter from a frequency control word to be adjusted to generate the frequency control word; or the signal generation sub-circuit is configured to, according to the second sub-control signal, add a second adjustment parameter to the frequency control word to be adjusted to generate the frequency control word.

For example, in the frequency locked loop provided by at least one embodiment of the present disclosure, the signal generation sub-circuit comprises an operation module and a storage module, the operation module is configured to, according to the first sub-control signal, subtract the first adjustment parameter from the frequency control word to be adjusted to generate the frequency control word, or the operation module is configured to, according to the second sub-control signal, add the second adjustment parameter to the frequency control word to be adjusted to generate the frequency control word; and the storage module is configured to store the frequency control word to be adjusted and the frequency control word.

For example, in the frequency locked loop provided by at least one embodiment of the present disclosure, the frequency detector comprises a first circuit, a second circuit, and a third frequency division circuit, a feedback period of the feedback signal comprises a first edge, a second edge, and a third edge, the second edge is between the first edge and the third edge, the third frequency division circuit is configured to receive an input signal having the input frequency and perform frequency division on the input signal to obtain a first intermediate signal having a first intermediate frequency; the first circuit is configured to judge and output a first logic value of the first edge, a second logic value of the second edge, and a third logic value of the third edge; and the second circuit is configured to generate and output the first sub-control signal or the second sub-control signal according to the first logic value, the second logic value, and the third logic value.

For example, in the frequency locked loop provided by at least one embodiment of the present disclosure, a third frequency division coefficient of the third frequency division circuit is 2, the first circuit comprises a first D flip-flop, a second D flip-flop, a third D flip-flop, a fourth D flip-flop, and a first NOT gate, and the second circuit comprises a first XOR gate, a second XOR gate, a second NOT gate, a third NOT gate, a first AND gate, and a second AND gate, a data input terminal of the first D flip-flop is configured to receive the first intermediate signal, a clock input terminal of the first D flip-flop is configured to receive the feedback signal, an output terminal of the first D flip-flop is connected to a data input terminal of the second D flip-flop and a first data input terminal of the first XOR gate, and the output terminal of the first D flip-flop is configured to output the first logic value; a clock input terminal of the second D flip-flop is configured to receive the feedback signal, an output terminal of the second D flip-flop is connected to a first data input terminal of the second XOR gate, and the output terminal of the second D flip-flop is configured to output the third logic value; the first NOT gate is configured to receive the feedback signal and invert the feedback signal to obtain an intermediate feedback signal; a data input terminal of the third D flip-flop is configured to receive the first intermediate signal, a clock input terminal of the third D flip-flop is configured to receive the intermediate feedback signal, and an output terminal of the third D flip-flop is connected to a data input terminal of the fourth D flip-flop; a clock input terminal of the fourth D flip-flop is configured to receive the feedback signal, an output terminal of the fourth D flip-flop is connected to a second data input terminal of the first XOR gate and a second data input terminal of the second XOR gate, and the output terminal of the fourth D flip-flop is configured to output the second logic value; an output terminal of the first XOR gate is connected to an input terminal of the second NOT gate and a first data input terminal of the first AND gate; an output terminal of the second XOR gate is connected to an input terminal of the third NOT gate and a second data input terminal of the first AND gate; an output terminal of the second NOT gate is connected to a first data input terminal of the second AND gate, and an output terminal of the third NOT gate is connected to a second data input terminal of the second AND gate; and an output terminal of the first AND gate is configured to output the first sub-control signal, and an output terminal of the second AND gate is configured to output the second sub-control signal.

For example, in the frequency locked loop provided by at least one embodiment of the present disclosure, the frequency control word is a positive integer.

For example, in the frequency locked loop provided by at least one embodiment of the present disclosure, the first adjustment parameter and the second adjustment parameter are both 1.

For example, the frequency locked loop provided by at least one embodiment of the present disclosure further comprises a first frequency division circuit, the first frequency division circuit is configured to generate the feedback frequency based on the target frequency and input the feedback signal having the feedback frequency to the control circuit, the feedback frequency is expressed as:

$$f_b = f_{dco}/N,$$

where $f_b$ represents the feedback frequency, $f_{dco}$ represents the target frequency, N represents a first frequency division coefficient of the first frequency division circuit, and N is a positive integer.

For example, in the frequency locked loop provided by at least one embodiment of the present disclosure, a relationship between the input frequency and the frequency control word is expressed as:

$$f_i = \frac{f_\Delta}{F \cdot N},$$

where $f_\Delta$ represents a frequency of a base time unit, and F represents the frequency control word; or, the relationship between the input frequency and the frequency control word is expressed as:

$$f_i = p \cdot f_1 + q \cdot f_2 = p \cdot \frac{f_\Delta}{F \cdot N} + q \cdot \frac{f_\Delta}{N \cdot (F+1)},$$

where, $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word.

For example, the frequency locked loop provided by at least one embodiment of the present disclosure further comprises a first frequency division circuit and a second frequency division circuit, the first frequency division circuit is configured to generate the feedback frequency based on the target frequency, and input the feedback signal having the feedback frequency to the control circuit, the second frequency division circuit is configured to perform frequency division on the input frequency to generate a second intermediate frequency, and input a second intermediate signal having the second intermediate frequency to the control circuit, the feedback frequency is expressed as:

$$f_b = f_{dco}/P,$$

where $f_b$ represents the feedback frequency, $f_{dco}$ represents the target frequency, P represents a first frequency division coefficient of the first frequency division circuit, P is a positive integer, and the second intermediate frequency is expressed as:

$$f_{im2} = f_1/D,$$

where $f_{im2}$ represents the second intermediate frequency, $f_i$ represents the input frequency, D represents a second frequency division coefficient of the second frequency division circuit, D is a positive integer, and P is greater than or equal to D.

For example, in the frequency locked loop provided by at least one embodiment of the present disclosure, a relationship between the input frequency and the frequency control word is expressed as:

$$f_i = \frac{f_\Delta D}{F \cdot P},$$

where $f_\Delta$ represents a frequency of a base time unit, and F represents the frequency control word; or, the relationship between the input frequency and the frequency control word is expressed as:

$$f_i = p \cdot f_1 + q \cdot f_2 = p \cdot \frac{f_\Delta \cdot D}{F \cdot P} + q \cdot \frac{f_\Delta \cdot D}{(F+1) \cdot P},$$

where $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word.

For example, in the frequency locked loop provided by at least one embodiment of the present disclosure, the digital control oscillation circuit comprises: a base time unit generation sub-circuit, configured to generate and output a base time unit; and a frequency adjustment sub-circuit, configured to generate and output the output signal having the target frequency according to the frequency control word and the base time unit.

At least one embodiment of the present disclosure also provides an electronic device, comprising: a frequency source, configured to provide an input signal having an input frequency; and the frequency locked loop according to any one of the above embodiments of the present disclosure.

At least one embodiment of the present disclosure also provides a frequency generation method based on the frequency locked loop according to any one of the above embodiments of the present disclosure, comprising: judging a size relationship between an input frequency and a feedback frequency to obtain a control signal, and determining a frequency control word according to the control signal, wherein the control signal comprises a first sub-control signal and a second sub-control signal, the first sub-control signal is generated in a case where the input frequency is greater than the feedback frequency, and the second sub-control signal that is different from the first sub-control signal is generated in a case where the input frequency is less than the feedback frequency; and generating and outputting an output signal having a target frequency according to the frequency control word.

For example, in the frequency generation method provided by at least one embodiment of the present disclosure, determining the frequency control word according to the control signal comprises: according to the first sub-control signal, subtracting a first adjustment parameter from a frequency control word to be adjusted to generate the frequency control word; or, according to the second sub-control signal, adding a second adjustment parameter to the frequency control word to be adjusted to generate the frequency control word.

BRIEF DESCRIPTION OF THE DRAWINGS

In order to clearly illustrate the technical solutions of the embodiments of the present disclosure, the drawings of the embodiments will be briefly described in the following; and it is obvious that the described drawings are only related to some embodiments of the present disclosure and thus are not limitative to the present disclosure.

DETAILED DESCRIPTION

Figure 1:
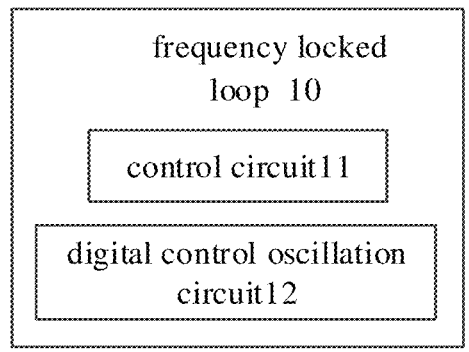
FIG. 1 is a schematic block diagram of a frequency locked loop provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may comprise an electrical connection, directly or indirectly. "On," "under," "right," "left" and the like are only used to indicate relative position relationship, and when the position of the object which is described is changed, the relative position relationship may be changed accordingly.

In order to keep the following description of embodiments of the present disclosure clear and concise, detailed descriptions of some known functions and known components are omitted from the present disclosure.

The clock signal is an important control signal. The clock signal can be generated directly by a frequency source or indirectly by a phase locked loop (PLL). A digital phase locked loop is currently a focus of research and development in a field of the phase locked loop. An oscillator in an all-digital phase locked loop (ADPLL) is called a digital oscillator, and the frequency of the digital oscillator is controlled by a variable using a digital value. ADPLL reduces a complexity of an analog design, so that ADPLL is suitable for digital processing. However, the digital oscillator in this ADPLL includes a large number of analog circuits, and is not a pure digital circuit.

At least one embodiment of the present disclosure provides a frequency locked loop, an electronic device, and a frequency generation method. The frequency locked loop controls to generate a frequency control word by a size relationship between an input frequency and a feedback frequency, and then generates a target frequency based on a time-average-frequency direct period (TAF-DPS) synthesizer. The frequency locked loop has the characteristics, such as high precision, fast response speed, low power consumption, small volume, programmability, and the like. The input frequency can be any value and does not need to correspond to the target frequency, and the frequency locked loop is a pure digital circuit and can be easily integrated into various chips. The frequency locked loop can be used in fields, such as microelectronics, sensing, control, measurement, driving, and the like.

Embodiments of the present disclosure are described in detail below with reference to the accompanying drawings, but the present disclosure is not limited to these specific embodiments.

Figure 2:
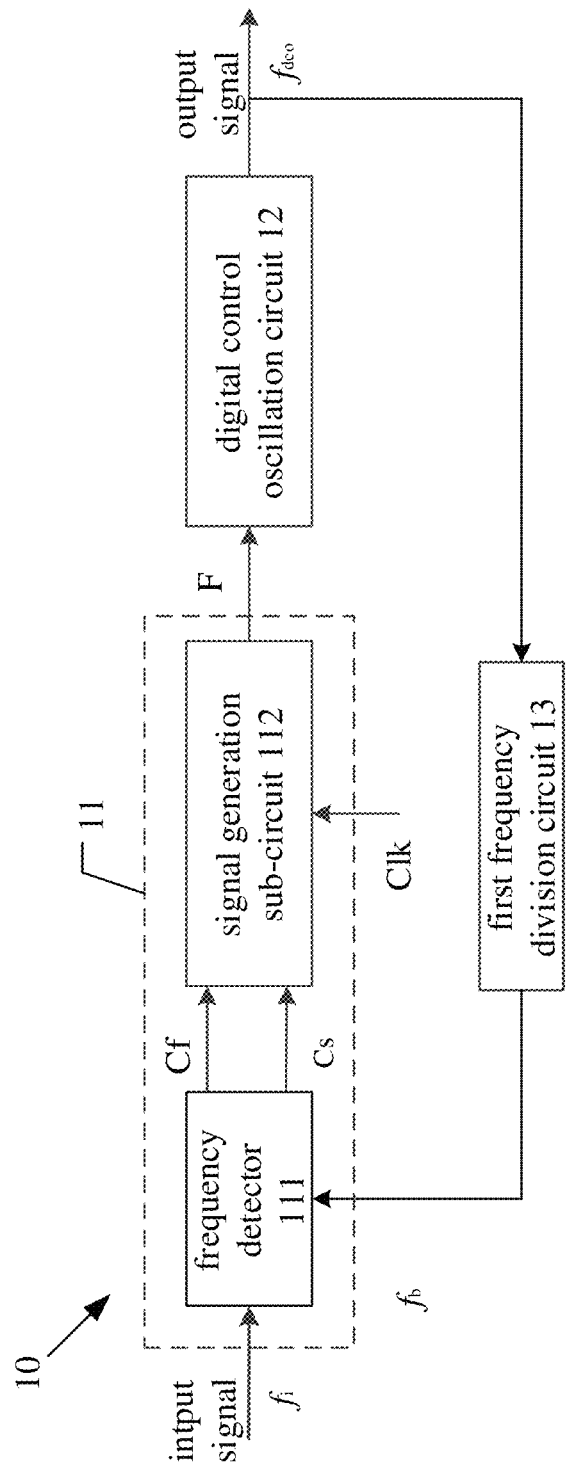
FIG. 2 is a structural schematic diagram of a frequency locked loop provided by an embodiment of the present disclosure.

FIG. 1 is a schematic block diagram of a frequency locked loop provided by an embodiment of the present disclosure, and FIG. 2 is a structural schematic diagram of a frequency locked loop provided by an embodiment of the present disclosure.

For example, as shown in FIG. 1, the frequency locked loop 10 may include a control circuit 11 and a digital control oscillation circuit 12. The control circuit 11 is configured to judge a size relationship between an input frequency and a feedback frequency to obtain a control signal, and determine a frequency control word according to the control signal. For example, the control signal may include a first sub-control signal and a second sub-control signal, the control circuit 11 is configured to generate the first sub-control signal in a case where the input frequency is greater than the feedback frequency, and the control circuit 11 is configured to generate the second sub-control signal that is different from the first sub-control signal in a case where the input frequency is less than the feedback frequency. The digital control oscillation circuit 12 is configured to generate and output an output signal having a target frequency according to the frequency control word.

For example, the input frequency can be any value. An input signal having the input frequency may be generated by a frequency source (for example, the frequency source may include a self-excited oscillation source and a synthetic frequency source). For example, the input frequency may represent a frequency of a signal actually generated and output by the frequency source. The target frequency represents a frequency of a signal expected by users. For example, the target frequency represents a frequency that the signal output by the frequency locked loop 10 can reach. For example, a ratio of the target frequency to the input frequency may be any value.

For example, as shown in FIG. 2, the control circuit 11 includes a frequency detector 111 and a signal generation sub-circuit 112.

For example, as shown in FIG. 2, the frequency detector 111 is configured to judge the size relationship between the input frequency $f_i$ and the feedback frequency $f_b$ to obtain the control signal. For example, the frequency detector 111 is configured to generate and output the first sub-control signal Cf in a case where the input frequency $f_i$ is greater than the feedback frequency $f_b$, and the frequency detector 100 is configured to generate and output the second sub-control signal Cs in a case where the input frequency $f_i$ is less than the feedback frequency $f_b$.

For example, in an example, the first sub-control signal Cf is valid when the first sub-control signal Cf is at a first level, and is invalid when the first sub-control signal Cf is at a second level. Similarly, the second sub-control signal Cs is valid when the second sub-control signal Cs is at the first level, and is invalid when the second sub-control signal Cs is at the second level. It should be noted that in the present disclosure, the first level may represent a high level and the second level may represent a low level, but embodiments of the present disclosure are not limited thereto, the first level may represent a low level, and accordingly, the second level may represent a high level. The setting of the first level and the second level may be determined according to specific actual conditions, and the embodiments of the present disclosure are not limited thereto. The embodiments of the present disclosure is described by taking a case that the first level represents a high level and the second level represents a low level as an example, this case may apply to the following embodiments, and will not be described again in the following embodiments.

For example, in a case where the input frequency $f_i$ is greater than the feedback frequency $f_b$, the frequency detector 111 is configured to generate and output the first sub-control signal Cf at the first level and the second sub-control signal Cs at the second level. In a case where the input frequency $f_i$ is less than the feedback frequency $f_b$, the frequency detector 111 is configured to generate and output the second sub-control signal Cs at the first level and the first sub-control signal Cf at the second level. In a case where the input frequency $f_i$ is equal to the feedback frequency $f_b$, the frequency detector 111 is configured to generate and output the first sub-control signal Cf at the second level and the second sub-control signal Cs at the second level. That is, in a case where the input frequency $f_i$ is greater than the feedback frequency $f_b$, the first sub-control signal Cf is valid and the second sub-control signal Cs is invalid; in a case where the input frequency $f_i$ is less than the feedback frequency $f_b$, the second sub-control signal Cs is valid and the first sub-control signal Cf is invalid; and in a case where the input frequency $f_i$ is equal to the feedback frequency $f_b$, neither the first sub-control signal Cf nor the second sub-control signal Cs is valid. It should be noted that in a case where the input frequency $f_i$ is greater than the feedback frequency $f_b$, the frequency detector 111 also may generate and output only the first sub-control signal Cf at the first level; in a case where the input frequency $f_i$ is less than the feedback frequency $f_b$, the frequency detector 111 also may generate and output only the second sub-control signal Cs at the first level; and in a case where the input frequency $f_i$ is equal to the feedback frequency $f_b$, the frequency detector 111 does not output a signal.

Figure 3:
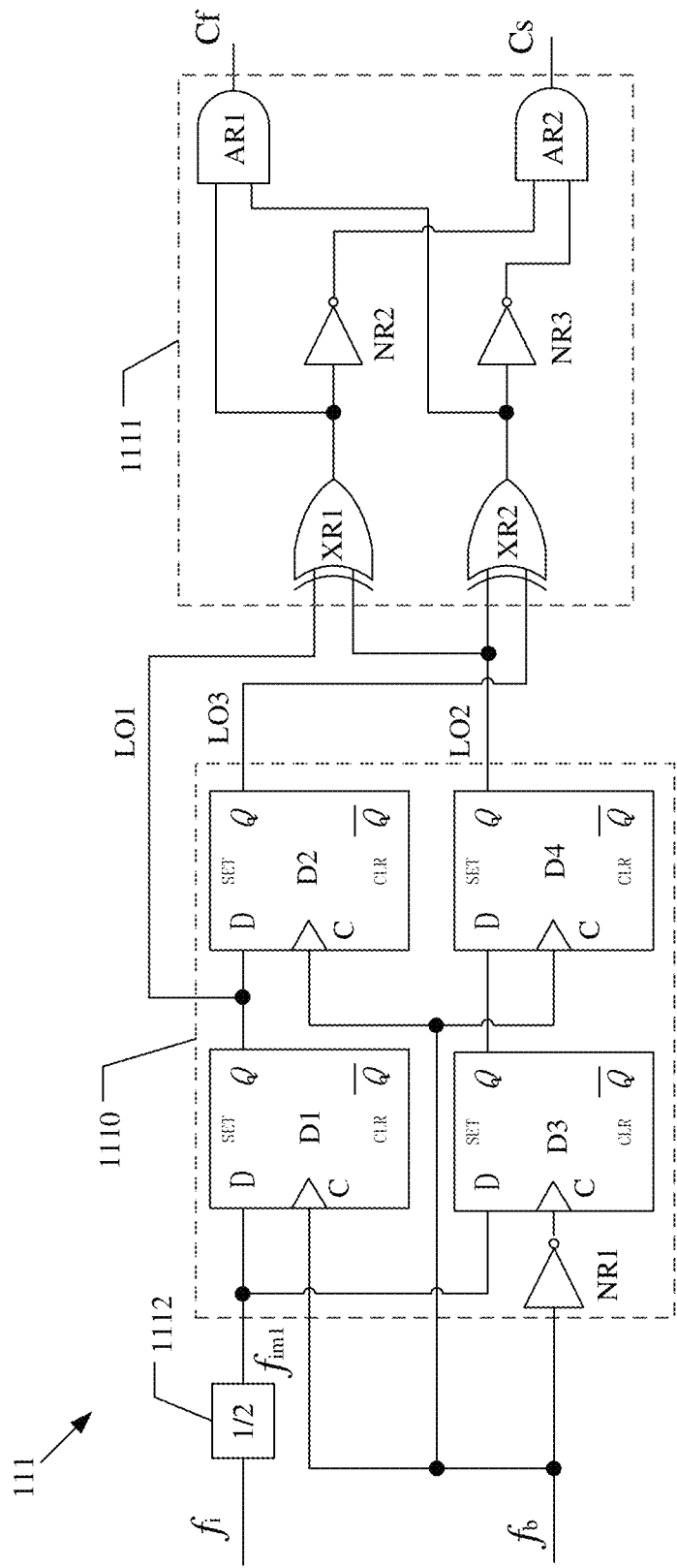
FIG. 3 is a schematic diagram of a circuit structure of a frequency detector provided by an embodiment of the present disclosure.
Figure 4A:
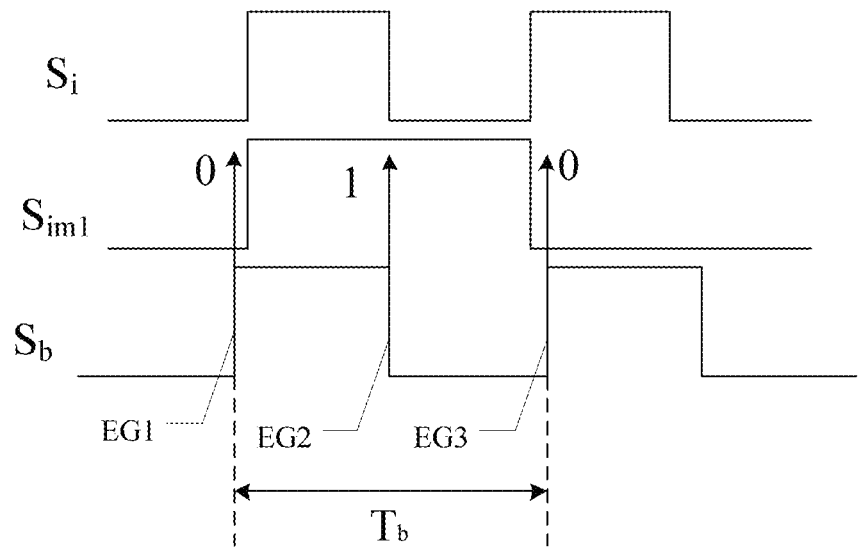
FIG. 4A is a timing chart in a case where a frequency detector generates a first sub-control signal provided by an embodiment of the present disclosure.
Figure 4B:
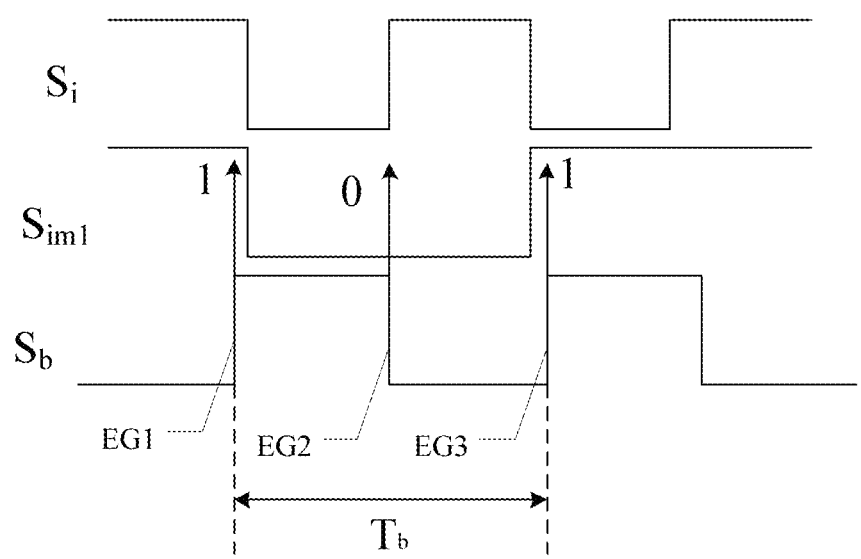
FIG. 4B is another timing chart in a case where a frequency detector generates a first sub-control signal provided by an embodiment of the present disclosure.
Figure 4C:
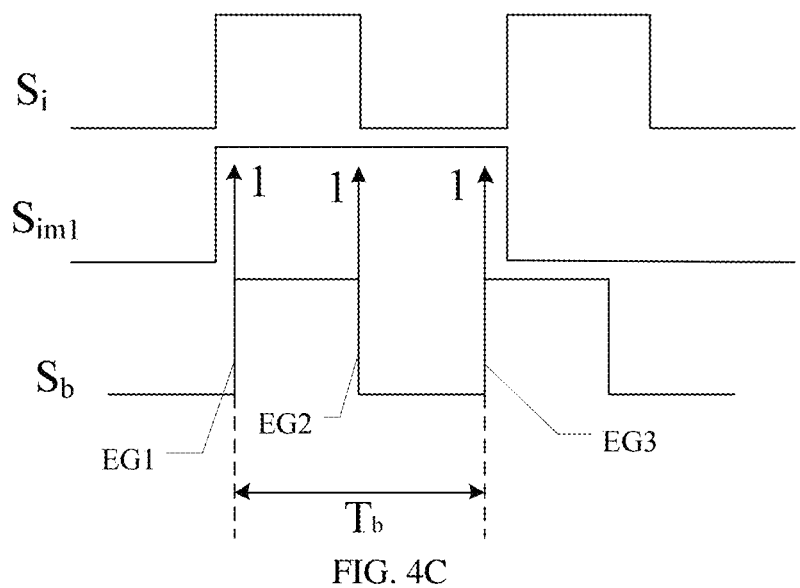
FIG. 4C is a timing chart in a case where a frequency detector generates a second sub-control signal provided by an embodiment of the present disclosure.
Figure 4D:
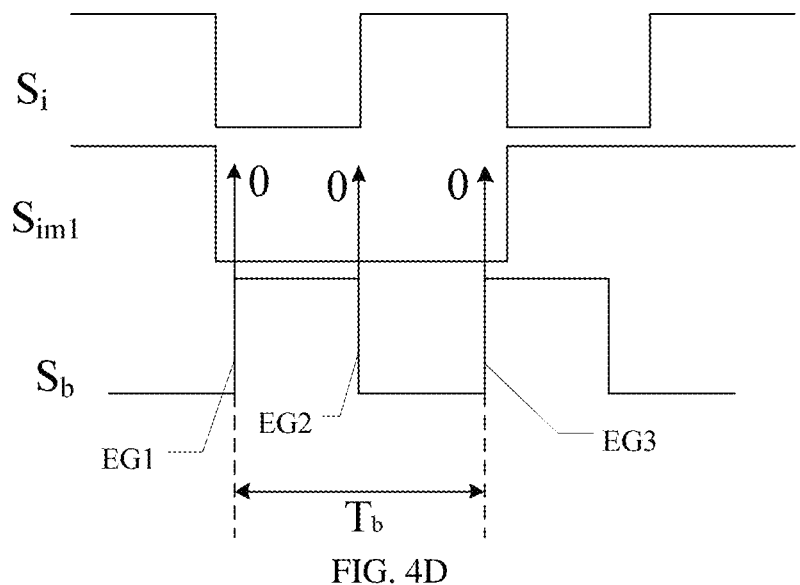
FIG. 4D is another timing chart in a case where a frequency detector generates a second sub-control signal provided by an embodiment of the present disclosure.

FIG. 3 is a schematic diagram of a circuit structure of a frequency detector provided by an embodiment of the present disclosure, FIG. 4A is a timing chart in a case where the frequency detector generates a first sub-control signal provided by an embodiment of the present disclosure, FIG. 4B is another timing chart in a case where the frequency detector generates a first sub-control signal provided by an embodiment of the present disclosure, FIG. 4C is a timing chart a case where the frequency detector generates a second sub-control signal provided by an embodiment of the present disclosure, and FIG. 4D is another timing chart in a case where the frequency detector generates a second sub-control signal provided by an embodiment of the present disclosure.

For example, as shown in FIG. 3, the frequency detector 111 may include a first circuit 1110, a second circuit 1111, and a third frequency division circuit 1112.

For example, as shown in FIGS. 4A-4D, a feedback period $T_b$ of the feedback signal $S_b$ having the feedback frequency $f_b$ may include a first edge EG1, a second edge EG2, and a third edge EG3, the second edge EG2 is between the first edge EG1 and the third edge EG3. In the example as shown in FIGS. 4A and 4B, the first edge EG1 and the third edge EG3 are both rising edges, i.e., edges of the feedback signal $S_b$ where the feedback signal $S_b$ changes from a low level to a high level; the second edge EG2 is a falling edge, that is, an edge of the feedback signal $S_b$ where the feedback signal $S_b$ changes from a high level to a low level. However, the present disclosure is not limited to this case. The first edge EG1 and the third edge EG3 may both be falling edges, and correspondingly, the second edge EG2 is a rising edge.

For example, in the present disclosure, a response time of the frequency detector 111 is one feedback period $T_b$ of the feedback signal $S_b$, and a response speed of the frequency detector 111 is fast.

It should be noted that in FIGS. 4A-4D, $S_i$ represents the input signal having the input frequency $f_i$, $S_{im1}$ represents a first intermediate signal having a first intermediate frequency $f_{im1}$, and $S_b$ represents the feedback signal having the feedback frequency $f_b$.

For example, as shown in FIG. 3, the third frequency division circuit 1112 is configured to receive the input signal $S_i$ having the input frequency $f_i$ and perform frequency division on the input signal to obtain the first intermediate signal $S_{im1}$ having the first intermediate frequency $f_{im1}$. For example, a third frequency division coefficient of the third frequency division circuit 1112 is 2.

For example, as shown in FIG. 3, the first circuit 1110 is configured to judge and output a first logic value LO1 of the first edge EG1, a second logic value LO2 of the second edge EG2, and a third logic value LO3 of the third edge EG3. The second circuit 1111 is configured to generate and output the first sub-control signal or the second sub-control signal according to the first logic value LO1, the second logic value LO2, and the third logic value LO3.

For example, the first circuit 1110 may include a first input terminal, a second input terminal, a first clock terminal, a second clock terminal, a first output terminal, a second output terminal, and a third output terminal. The first input terminal and the second input terminal of the first circuit 1110 are configured to receive the first intermediate signal $S_{im1}$, the first clock terminal and the second clock terminal of the first circuit 1110 are configured to receive the feedback signal $S_b$, the first output terminal of the first circuit 1110 is configured to output the first logic value LO1 of the first edge EG1, the second output terminal of the first circuit 1110 is configured to output the second logic value LO2 of the second edge EG2, and the third output terminal of the first circuit 1110 is configured to output the third logic value LO3 of the third edge EG3.

For example, the second circuit 1111 may include a first input terminal, a second input terminal, a third input terminal, a fourth input terminal, a first output terminal, and a second output terminal. The first output terminal of the first circuit 1110 is electrically connected to the first input terminal of the second circuit 1111, the second output terminal of the first circuit 1110 is electrically connected to the second input terminal and the third input terminal of the second circuit 1111, the third output terminal of the first circuit 1110 is electrically connected to the fourth input terminal of the second circuit 1111, the first output terminal of the second circuit 1111 is configured to output the first sub-control signal, and the second output terminal of the second circuit 1111 is configured to output the second sub-control signal.

For example, in an example, as shown in FIG. 3, the first circuit 1110 may include a first D flip-flop D1, a second D flip-flop D2, a third D flip-flop D3, a fourth D flip-flop D4, and a first NOT gate NR1. The second circuit 1111 includes a first XOR gate XR1, a second XOR gate XR2, a second NOT gate NR2, a third NOT gate NR3, a first AND gate AR1, and a second AND gate AR2.

For example, each D flip-flop may include a data input terminal D, a clock input terminal C, a preset terminal SET, a reset terminal CLR, an output terminal Q, and an output terminal $\overline{Q}$. For example, as shown in FIG. 3, the first input terminal of the first circuit 1110 is the data input terminal D of the first D flip-flop D1, the second input terminal of the first circuit 1110 is the data input terminal D of the third D flip-flop D3, the first clock terminal of the first circuit 1110 includes the clock input terminal C of the first D flip-flop D1, the clock input terminal C of the second D flip-flop D2, and the clock input terminal C of the fourth D flip-flop D4. The second clock terminal of the first circuit 1110 is an input terminal of the first NOT gate NR1, the first output terminal of the first circuit 1110 is the output terminal Q of the first D flip-flop D1, the second output terminal of the first circuit 1110 is the output terminal Q of the fourth D flip-flop D4, and the third output terminal of the first circuit 1110 is the output terminal Q of the second D flip-flop D2.

For example, the first input terminal of the second circuit 1111 is a first data input terminal of the first XOR gate XR1, the second input terminal of the second circuit 1111 is a second data input terminal of the first XOR gate XR1, the third input terminal of the second circuit 1111 is a second data input terminal of the second XOR gate XR2, the fourth input terminal of the second circuit 1111 is a first data input terminal of the second XOR gate XR2, the first output terminal of the second circuit 1111 is an output terminal of the first AND gate AR1, and the second output terminal of the second circuit 1111 is an output terminal of the second AND gate AR2.

For example, as shown in FIG. 3, the data input terminal D of the first D flip-flop D1 is electrically connected to an output terminal of the third frequency division circuit 1112 and is configured to receive the first intermediate signal $S_{im1}$, the clock input terminal C of the first D flip-flop D1 is configured to receive the feedback signal $S_b$, the output terminal Q of the first D flip-flop D1 is connected to the data input terminal D of the second D flip-flop D2 and the first data input terminal of the first XOR gate XR1, and the output terminal Q of the first D flip-flop D1 is configured to output the first logic value LO1. The clock input terminal C of the second D flip-flop D2 is configured to receive the feedback signal $S_b$, the output terminal Q of the second D flip-flop D2 is connected to the first data input terminal of the second XOR gate XR2, and the output terminal Q of the second D flip-flop D2 is configured to output the third logic value LO3.

For example, as shown in FIG. 3, the first NOT gate NR1 is configured to receive the feedback signal $S_b$ and invert the feedback signal $S_b$ to obtain an intermediate feedback signal. For example, an input terminal of the first NOT gate NR1 is configured to receive the feedback signal, and an output terminal of the first NOT gate NR1 is configured to output the intermediate feedback signal.

For example, as shown in FIG. 3, the data input terminal D of the third D flip-flop D3 is electrically connected to the output terminal of the third frequency division circuit 1112 and is configured to receive the first intermediate signal $S_{im1}$, the clock input terminal C of the third D flip-flop D3 is electrically connected to the output terminal of the first NOT gate NR1 and is configured to receive the intermediate feedback signal, and the output terminal Q of the third D flip-flop D3 is connected to the data input terminal D of the fourth D flip-flop D4. The clock input terminal C of the fourth D flip-flop D4 is configured to receive the feedback signal $S_b$, the output terminal Q of the fourth D flip-flop D4 is connected to the second data input terminal of the first XOR gate XR1 and the second data input terminal of the second XOR gate XR2, and the output terminal Q of the fourth D flip-flop D4 is configured to output the second logic value LO2.

For example, as shown in FIG. 3, the output terminal of the first XOR gate XR1 is connected to an input terminal of the second NOT gate NR2 and an first data input terminal of the first AND gate AR1; an output terminal of the second XOR gate XR2 is connected to an input terminal of the third NOT gate NR3 and an second data input terminal of the first AND gate AR1; an output terminal of the second NOT gate NR2 is connected to a first data input terminal of the second AND gate AR2, and an output terminal of the third NOT gate NR3 is connected to a second data input terminal of the second AND gate AR2; and an output terminal of the first AND gate AR1 is configured to output the first sub-control signal Cf, and an output terminal of the second AND gate AR2 is configured to output the second sub-control signal Cs.

For example, as shown in FIG. 4A, in a case where the input frequency $f_i$ is greater than the feedback frequency $f_b$, a level of the first intermediate signal $S_{im1}$ corresponding to the first edge EG1 of the feedback signal $S_b$ is a low level at a certain time, and thus, the first logic value LO1 of the first edge EG1 is 0 at this time; a level of the first intermediate signal $S_{im1}$ corresponding to the second edge EG2 of the feedback signal $S_b$ is a high level, and thus, the second logic value LO2 of the second edge EG2 is 1 at this time; a level of the first intermediate signal $S_{im1}$ corresponding to the third edge EG3 of the feedback signal $S_b$ is a low level, and thus, the third logic value LO3 of the third edge EG3 is 0. In the example as shown in FIG. 4A, at this time, the first XOR gate XR1 receives the first logic value LO1 (i.e., 0) and the second logic value LO2 (i.e., 1), and outputs a logic value 1 according to the first logic value LO1 and the second logic value LO2, the second XOR gate XR2 receives the second logic value LO2 (i.e., 1) and the third logic value (i.e., 0), and outputs a logic value 1 according to the second logic value LO2 and the third logic value LO3. At this time, both the first data input terminal and the second data input terminal of the first AND gate AR1 receive the logic value 1, and thereby, the first AND gate AR1 outputs the first sub-control signal Cf having a high level; and the first data input terminal and the second data input terminal of the second AND gate AR2 both receive the logic value 0, and thus, the second AND gate AR2 outputs the second sub-control signal Cs having a low level.

For example, as shown in FIG. 4B, in a case where the input frequency $f_i$ is greater than the feedback frequency $f_b$, a level of the first intermediate signal $S_{im1}$ corresponding to the first edge EG1 of the feedback signal $S_b$ is a high level at a certain time, then the first logic value LO1 of the first edge EG1 is 1 at this time; a level of the first intermediate signal $S_{im1}$ corresponding to the second edge EG2 of the feedback signal $S_b$ is a low level, and the second logic value LO2 of the second edge EG2 is 0; a level of the first intermediate signal $S_{im1}$ corresponding to the third edge EG3 of the feedback signal $S_b$ is a high level, and the third logic value LO3 of the third edge EG3 is 1. In the example as shown in FIG. 4B, at this time, the first XOR gate XR1 receives the first logic value LO1 (i.e., 1) and the second logic value LO2 (i.e., 0), and outputs a logic value 1 according to the first logic value LO1 and the second logic value LO2, and the second XOR gate XR2 receives the second logic value LO2 (i.e., 0) and the third logic value LO3 (i.e., 1), and outputs a logic value 1 according to the second logic value LO2 and the third logic value LO3. At this time, both the first data input terminal and the second data input terminal of the first AND gate AR1 receive the logic value 1, thereby the first AND gate AR1 outputs the first sub-control signal Cf having a high level; and the first data input terminal and the second data input terminal of the second AND gate AR2 both receive the logic value 0, whereby the second AND gate AR2 outputs the second sub-control signal Cs having a low level.

It should be noted that in a case where the input frequency $f_i$ is greater than the feedback frequency $f_b$, except for the time as shown in FIGS. 4A and 4B, under control of the first logic value LO1, the second logic value LO2, and the third logic value LO3, one of the first XOR gate XR1 and the second XOR gate XR2 outputs a logic value 1 and the other of the first XOR gate XR1 and the second XOR gate XR2 outputs a logic value 0. In these cases, the first AND gate AR1 outputs the first sub-control signal Cf having a low level; and the second AND gate AR2 outputs the second sub-control signal Cs having a low level.

For example, as shown in FIG. 4C, in a case where the input frequency $f_i$ is less than the feedback frequency $f_b$, a level of the first intermediate signal $S_{im1}$ corresponding to the first edge EG1 of the feedback signal $S_b$ is a high level at a certain time, and then the first logic value LO1 of the first edge EG1 is 1 at this time; a level of the first intermediate signal $S_{im1}$ corresponding to the second edge EG2 of the feedback signal $S_b$ is a high level, so the second logic value LO2 of the second edge EG2 is 1 at this time; a level of the first intermediate signal $S_{im1}$ corresponding to the third edge EG3 of the feedback signal $S_b$ is a high level, so the third logic value LO3 of the third edge EG3 is 1. In the example as shown in FIG. 4C, at this time, the first XOR gate XR1 receives the first logic value LO1 (i.e., 1) and the second logic value LO2 (i.e., 1), and outputs a logic value 0 according to the first logic value LO1 and the second logic value LO2, and the second XOR gate XR2 receives the second logic value LO2 (i.e., 1) and the third logic value LO3 (i.e., 1), and outputs a logic value 0 according to the second logic value LO2 and the third logic value LO3. At this time, both the first data input terminal and the second data input terminal of the first AND gate AR1 receive the logic value 0, so that the first AND gate AR1 outputs the first sub-control signal Cf having a low level; and the first data input terminal and the second data input terminal of the second AND gate AR2 both receive the logic value 1, so that the second AND gate AR2 outputs the second sub-control signal Cs having a high level.

For example, as shown in FIG. 4D, in a case where the input frequency $f_i$ is less than the feedback frequency $f_b$, a level of the first intermediate signal $S_{im1}$ corresponding to the first edge EG1 of the feedback signal $S_b$ is a low level at a certain time, so that the first logic value LO1 of the first edge EG1 is 0 at this time; a level of the first intermediate signal $S_{im1}$ corresponding to the second edge EG2 of the feedback signal $S_b$ is a low level, and thus, the second logic value LO2 of the second edge EG2 is 0; and a level of the first intermediate signal $S_{im1}$ corresponding to the third edge EG3 of the feedback signal $S_b$ is a low level, so the third logic value LO3 of the third edge EG3 is 0. In the example as shown in FIG. 4D, at this time, the first XOR gate XR1 receives the first logic value LO1 (i.e., 0) and the second logic value LO2 (i.e., 0), and outputs a logic value 0 according to the first logic value LO1 and the second logic value LO2, and the second XOR gate XR2 receives the second logic value LO2 (i.e., 0) and the third logic value LO3 (i.e., 0), and outputs a logic value 0 according to the second logic value LO2 and the third logic value LO3. At this time, both the first data input terminal and the second data input terminal of the first AND gate AR1 receive the logic value 0, and thereby, the first AND gate AR1 outputs the first sub-control signal Cf having a low level; and the first data input terminal and the second data input terminal of the second AND gate AR2 both receive the logic value 1, and thereby, the second AND gate AR2 outputs the second sub-control signal Cs having a high level.

It should be noted that in a case where the input frequency $f_i$ is less than the feedback frequency $f_b$, except for the time as shown in FIGS. 4C and 4D, one of the first XOR gate XR1 and the second XOR gate XR2 outputs the logic value 1 and the other of the first XOR gate XR1 and the second XOR gate XR2 outputs the logic value 0 under control of the first logic value LO1, the second logic value LO2 and the third logic value LO3. In these cases, the first AND gate AR1 outputs the first sub-control signal Cf having a low level; and the second AND gate AR2 outputs the second sub-control signal Cs having a low level.

For example, as shown in FIG. 2, the signal generation sub-circuit 112 is configured to generate a frequency control word F according to the control signal and output the frequency control word F to the digital control oscillation circuit 12 under control of a clock signal Clk. For example, the clock signal may be the output signal or the feedback signal having the feedback frequency.

For example, the frequency control word F may be a positive integer, thereby improving the accuracy of the outputted target frequency. However, the present disclosure is not limited thereto, and the frequency control word F may also be a positive real number, that is, the frequency control word may include a decimal part and an integer part.

For example, the signal generation sub-circuit 112 is configured to, according to the first sub-control signal Cf, subtract an first adjustment parameter from a frequency control word to be adjusted to generate the frequency control word F; or, the signal generation sub-circuit 112 is configured to, according to the second sub-control signal Cs, add a second adjustment parameter to the frequency control word to be adjusted to generate the frequency control word F.

For example, before the frequency control word is adjusted (for example, before the frequency locked loop is put into use), the frequency control word to be adjusted may be randomly set or set according to actual requirements. In the subsequent adjustment process, the frequency control word to be adjusted is a frequency control word obtained in the adjacent previous adjustment process, that is, for example, in a first adjustment process, the signal generation sub-circuit 112 adjusts an initial frequency control word to be adjusted according to the control signal, to obtain, for example, a first frequency control word, the first frequency control word is output to the digital control oscillation circuit 12, and at the same time, the first frequency control word may also be stored in the signal generation sub-circuit 112 and serve as a frequency control word to be adjusted in, for example, a second adjustment process; and in the second adjustment process, the signal generation sub-circuit 112 adjusts the first frequency control word according to the control signal to obtain, for example, a second frequency control word, the second frequency control word is output to the digital control oscillation circuit 12, and at the same time, the second frequency control word may also be stored in the signal generation sub-circuit 112 and serve as a frequency control word to be adjusted, for example, in a third adjustment process, and so on.

Figure 5:
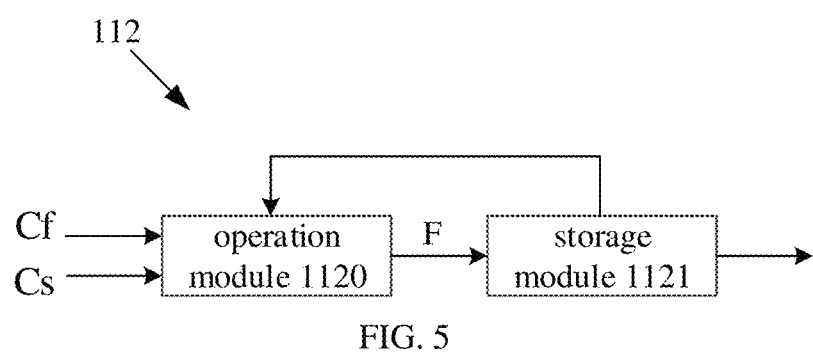
FIG. 5 is a structural schematic diagram of a signal generation sub-circuit provided by an embodiment of the present disclosure.

FIG. 5 is a structural schematic diagram of a signal generation sub-circuit provided by an embodiment of the present disclosure.

For example, in some embodiments, as shown in FIG. 5, the signal generation sub-circuit 112 may include an operation module 1120 and a storage module 1121. The operation module 1120 is configured to, according to the first sub-control signal Cf, subtract the first adjustment parameter from the frequency control word to be adjusted to generate the frequency control word F; or, the operation module 1120 is configured to, according to the second sub-control signal Cs, add the second adjustment parameter to the frequency control word to be adjusted to generate the frequency control word F. The storage module 1121 is configured to store the frequency control word to be adjusted and the frequency control word F.

For example, in some embodiments, signs of the first adjustment parameter and the second adjustment parameter are the same, the first adjustment parameter and the second adjustment parameter may be the same, and both the first adjustment parameter and the second adjustment parameter are 1. However, the present disclosure is not limited to this case, for example, the first adjustment parameter and the second adjustment parameter are both 2; for another example, the first adjustment parameter may be different from the second adjustment parameter, the first adjustment parameter may be 1 and the second adjustment parameter may be 2. In other embodiments, a sign of the first adjustment parameter may be opposite to a sign of the second adjustment parameter. For example, the first adjustment parameter may be −1 and the second adjustment parameter may be 1. In this case, the signal generation sub-circuit 112 may include an adder and a storage module. The adder is configured to, according to the first sub-control signal Cf, add the first adjustment parameter to the frequency control word to be adjusted to generate the frequency control word F; or, the adder is configured to, according to the second sub-control signal Cs, add the second adjustment parameter to the frequency control word to be adjusted to generate the frequency control word F. The storage module is configured to store the frequency control word to be adjusted and the frequency control word F.

For example, the signal generation sub-circuit 112 may further include an output module (not shown), and the output module is used for acquiring the frequency control word F from, for example, the storage module 1121 under control of the clock signal Clk, and outputting the frequency control word F to the digital control oscillation circuit 12.

For example, the storage module 1121 may be various types of storage media. The operation module 1120 and the output module may be implemented by hardware circuits. The operation module 1120 may be composed of, for example, transistors, resistors, capacitors, amplifiers, and the like. The output module may be constituted by elements, such as flip-flops. Of course, the functions of the operation module 1120 and the output module can also be achieved by software. For example, the storage module 1121 may also store computer instructions and data, and a processor may execute the computer instructions and data stored in the storage module 1121 to implement the functions of the operation module 1120 and the output module.

Figure 6:
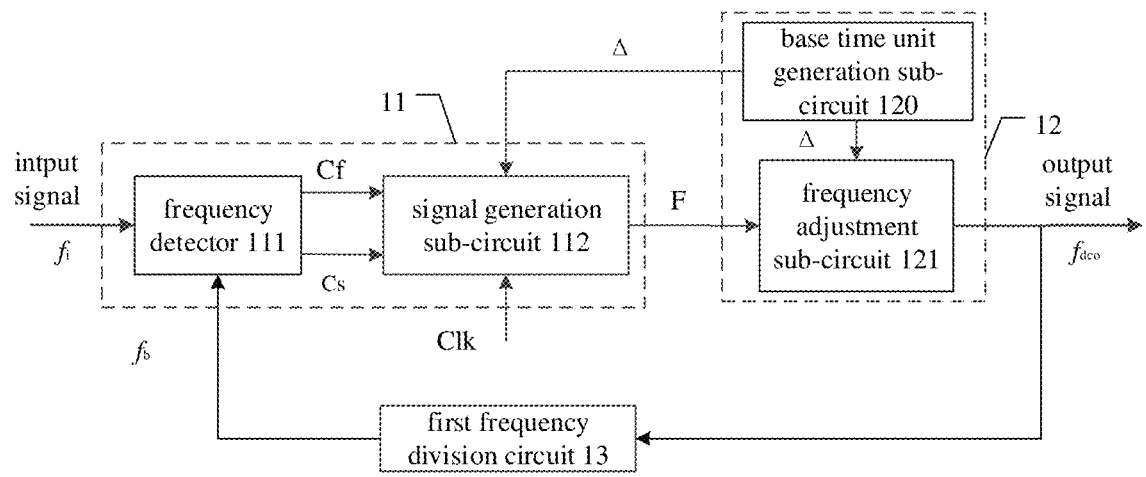
FIG. 6 is a structural schematic diagram of another frequency locked loop provided by an embodiment of the present disclosure.

FIG. 6 is a structural schematic diagram of another frequency locked loop provided by an embodiment of the present disclosure.

For example, as shown in FIG. 6, the digital control oscillation circuit 12 may include a base time unit generation sub-circuit 120 and a frequency adjustment sub-circuit 121. The base time unit generation sub-circuit 120 is configured to generate and output a base time unit. The frequency adjustment sub-circuit 121 is configured to generate and output the output signal having the target frequency $f_{dco}$ according to the frequency control word and the base time unit.

Figure 7A:
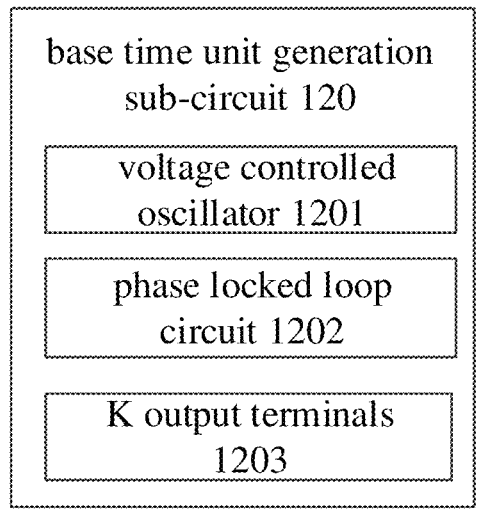
FIG. 7A shows a schematic block diagram of a base time unit generation sub-circuit provided by an embodiment of the present disclosure.
Figure 7B:
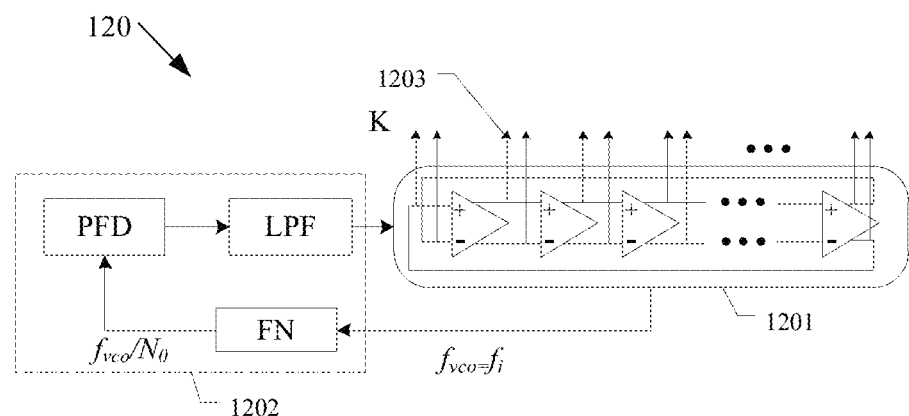
FIG. 7B shows a structural schematic diagram of a base time unit generation sub-circuit provided by an embodiment of the present disclosure.
Figure 8:
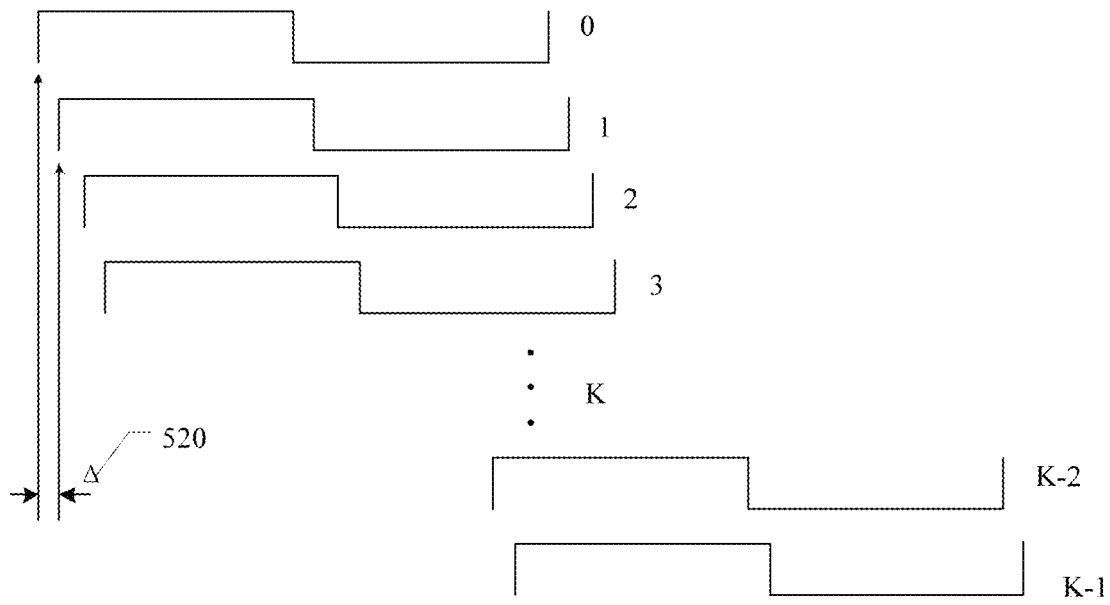
FIG. 8 is a schematic diagram of K reference output signals with phases evenly spaced provided by an embodiment of the present disclosure.

FIG. 7A shows a schematic block diagram of a base time unit generation sub-circuit provided by an embodiment of the present disclosure; FIG. 7B shows a structural schematic diagram of a base time unit generation sub-circuit provided by an embodiment of the present disclosure; and FIG. 8 is a schematic diagram of K reference output signals with phases evenly spaced according to an embodiment of the present disclosure.

For example, the base time unit generation sub-circuit 120 is configured to generate and output K reference output signals with phases evenly spaced and a base time unit Δ. As shown in FIG. 7A, the base time unit generation sub-circuit 120 may include a voltage controlled oscillator (VCO) 1201, a phase locked loop circuit 1202, and K output terminals 1203. The voltage controlled oscillator 1201 is configured to oscillate at a predetermined oscillation frequency. The phase locked loop circuit 1202 is configured to lock an output frequency of the voltage controlled oscillator 1201 to a reference output frequency. The K output terminals 1203 are configured to output K reference output signals with phases evenly spaced, where K is a positive integer greater than 1. For example, K=16, 32, 128, or other values.

For example, the base time unit may be expressed as Δ, and the reference output frequency may be expressed as $f_d$. As shown in FIG. 8, the base time unit Δ is a time span between any two adjacent output signals output by the K output terminals 1203. The base time unit Δ is normally generated by a plurality of stages of voltage controlled oscillators 1201. The frequency $f_{vco}$ of the signal generated by the voltage controlled oscillator 1201 may be locked to a known reference output frequency $f_d$, i.e., $f_d = f_{vco}$, by the phase locked loop circuit 1202.

For example, the base time unit Δ can be calculated using the following formula:

$$\Delta = T_d/K = 1/(K \cdot f_d)$$

where $T_d$ represents a period of a signal generated by the plurality of stages of voltage controlled oscillators 1201. $f_A$ represents the frequency of the base time unit, and then $f_A = 1/\Delta = K \cdot f_d$.

For example, as shown in FIG. 7B, the phase locked loop circuit 1202 includes a phase frequency detector (PFD), a loop filter (LPF), and a frequency divider (FN). For example, in an embodiment of the present disclosure, first, a reference signal having a reference frequency may be input to the phase frequency detector, then into the loop filter, and then into the voltage controlled oscillator, finally, a signal having a predetermined oscillation frequency $f_{vco}$ generated by the voltage controlled oscillator may be divided by the frequency divider to obtain a frequency division frequency $f_{vco}/N0$ of a frequency division signal, the frequency division frequency $f_{vco}/N0$ is fed back to the phase frequency detector, the phase frequency detector is used to compare the reference frequency of the reference signal with the frequency division frequency $f_{vco}/N0$. In a case where the frequency and phase of the reference frequency are equal to the frequency and the phase of the frequency division frequency $f_{vco}/N$, respectively, an error between the reference frequency and the frequency division frequency $f_{vco}/N$ is zero. At this time, the phase locked loop circuit 1202 is in a locked state.

For example, the loop filter may be a low pass filter. A frequency division coefficient of the frequency divider is $N_0$, $N_0$ is a real number, and N0 is greater than or equal to one.

It is worth noting that the circuit structure as shown in FIG. 7B is only one exemplary implementation of the base time unit generation sub-circuit 120. The specific structure of the base time unit generation sub-circuit 120 is not limited to this case, the base time unit generation sub-circuit 120 may also be constructed by other circuit structures, and the present disclosure is not limited thereto. For example, K and Δ can be set in advance according to actual needs and are fixed.

Figure 9:
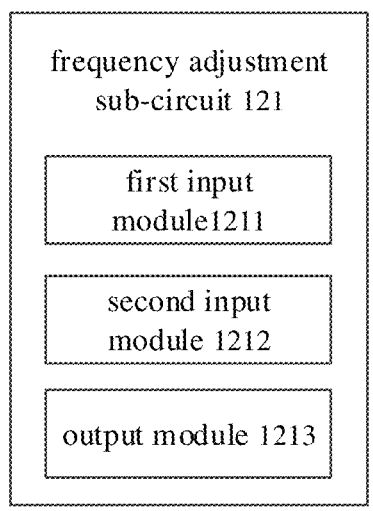
FIG. 9 shows a schematic block diagram of a frequency adjustment sub-circuit provided by an embodiment of the present disclosure.
Figure 10:
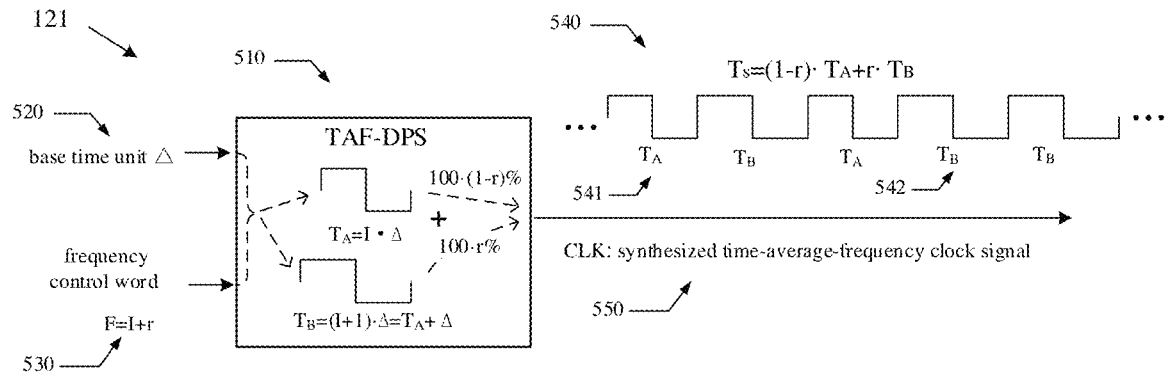
FIG. 10 shows a schematic diagram of a working principle of a frequency adjustment sub-circuit provided by an embodiment of the present disclosure.

FIG. 9 shows a schematic block diagram of a frequency adjustment sub-circuit provided by an embodiment of the present disclosure; and FIG. 10 shows a schematic diagram of a working principle of a frequency adjustment sub-circuit provided by an embodiment of the present disclosure.

For example, as shown in FIG. 9, the frequency adjustment sub-circuit 121 includes a first input module 1211, a second input module 1212, and an output module 1213. The first input module 1211 is configured to receive K reference output signals with phases evenly spaced and the base time unit output from the base time unit generation sub-circuit 120. The second input module 1212 is configured to receive the frequency control word F from the control circuit 11. The output module 1213 is configured to generate and output the output signal that has the target frequency and matches the frequency control word and the base time unit.

For example, the frequency adjustment sub-circuit 121 may include a time-average-frequency direct period (TAF-DPS) synthesizer. Time-average-frequency direct period synthesis (TAF-DPS) technology is an emerging frequency synthesis technology, and can generate pulse signals of any frequency based on the new concept of time-average frequency. In other words, TAF-DPS synthesizer can achieve fine frequency adjustment with small frequency granularity. In addition, because each single pulse is directly constructed, the output frequency of the TAF-DPS synthesizer can be changed instantaneously, i.e. the TAF-DPS synthesizer has the characteristics of rapidity of frequency switching. Experiments show that the frequency granularity of TAF-DPS synthesizer can reach several ppb (parts per billion). More importantly, a frequency switching speed of AF-DPS is quantifiable. That is, the response time from the time, when the frequency control word is updated, to the time, when the frequency is switched, can be calculated according to the clock cycle. These characteristics enable TAF-DPS to be an ideal circuit module for the digital controlled oscillator (DCO). The TAF-DPS synthesizer can be used as a specific implementation of the frequency adjustment sub-circuit 121 in the embodiments of the present disclosure.

Therefore, the advantages of the frequency locked loop provided by the embodiments of the present disclosure include, but are not limited to:

(1) Low cost and flexibility in implementation. The frequency locked loop based on TAF-DPS is completely digitally designed, and is fired into programmable logic devices (e.g., FPGA) through HDL coding. The parameters of the frequency locked loop can also be easily reset at any time. Therefore, the function of frequency locked loop can be achieved by using general FPGA or other programmable devices without using special dedicated circuits. Of course, ASIC can also be used to implement the function of frequency locked loop.

(2) High precision. The frequency/period of the pulse signal output by TAF-DPS can be accurately controlled, and the frequency resolution can reach parts per billion, thus effectively improving the time synchronization accuracy.

(3) The frequency locked loop based on TAF-DPS performs de-alienation on structures of a decimal frequency locked loop and an integer frequency locked loop. The structures of the main frequency detectors and oscillators in the decimal frequency locked loop and the integer frequency locked loop are the same.

(4) The jitter of the clock signal output from the frequency locked loop based on TAF-DPS is only related to TAF-DPS, and is not related to other devices in the whole frequency locked loop. Because the whole frequency locked loop is transmitted by digital signals, TAF-DPS will output the corresponding frequency as long as TAF-DPS receives the frequency control word, so the quality of the output signal is only related to TAF-DPS, which is more conducive to the consistency analysis of clock signals.

For example, the TAF-DPS synthesizer may be implemented using an application specific integrated circuit (e.g., ASIC) or a programmable logic device (e.g., FPGA). Alternatively, the TAF-DPS synthesizer can be implemented using conventional analog circuit devices. The present disclosure is not limited to this case herein.

It should be noted that in the present disclosure, ppm and ppb can both be used to represent frequency deviation, and ppm and ppb represent values of allowable frequency deviation at a specific center frequency. For example, X ppm represents that a maximum frequency error is X parts per million of the center frequency; and similarly, X ppb represents that the maximum frequency error is X parts per billion of the center frequency. The frequency is in hertz (Hz).

Next, a working principle of the frequency adjustment sub-circuit 121 based on the TAF-DPS synthesizer will be described with reference to FIG. 10.

For example, as shown in FIG. 10, the frequency adjustment sub-circuit 122 based on the TAF-DPS synthesizer 510 has two inputs: a base time unit 520 and a frequency control word 530. The frequency control word 530 is expressed as F, F=I+r, and I is an integer greater than one, and r is a fraction.

For example, TAF-DPS synthesizer 510 has an output CLK 550. The CLK 550 is a synthesized time-average-frequency clock signal. In the embodiment of the present disclosure, CLK 550 is the output signal having the target frequency. According to the base time unit 520, the TAF-DPS synthesizer 510 can generate two types of periods, i.e., a first period $T_A = I \cdot \Delta$ and the second period $T_B = (I+1) \cdot \Delta$. The output CLK 550 is a clock pulse string 540, and the clock pulse string 540 includes a first period TA 541 and a second period TB 542 in an interleaved manner. The fraction r is used to control an occurrence probability of the second period $T_B$, therefore, r can also determine the occurrence probability of the first period $T_A$. For example, in the present disclosure, r is zero. Thus, the TAF-DPS synthesizer 510 generates only one type of period, for example, the first period $T_A$.

For example, as shown in FIG. 10, the period $T_{TAF-DPS}$ of the output signal CLK 550 can be expressed by the following formula:

$$T_{dco} = (1-r) \cdot T_A + r \cdot T_B$$
$$= T_A + r \cdot (T_B - T_A) = T_A + r \cdot \Delta$$
$$= I \cdot \Delta + r \cdot \Delta = (I+r) \cdot \Delta = I \cdot \Delta$$

Therefore, in a case where the frequency control word 530 is F=I, it can be obtained:

$$T_{dco} = F \cdot \Delta \quad (1)$$

From the above equation (1), it can be seen that a period $T_{dco}$ of the output signal CLK output by the TAF-DPS synthesizer 510 is linearly proportional to the frequency control word 530. In a case where the frequency control word 530 changes, the period $T_{dco}$ of the output signal output by the TAF-DPS synthesizer 510 will also change in the same form.

For example, based on the above formula (1), the target frequency $f_{dco}$ may be expressed as:

$$f_{dco} = 1/T_{dco} = 1/(F \cdot \Delta) = f_\Delta/F,$$

where $\Delta$ represents the base time unit, and $f_\Delta$ represents the frequency of the base time unit.

Figure 11A:
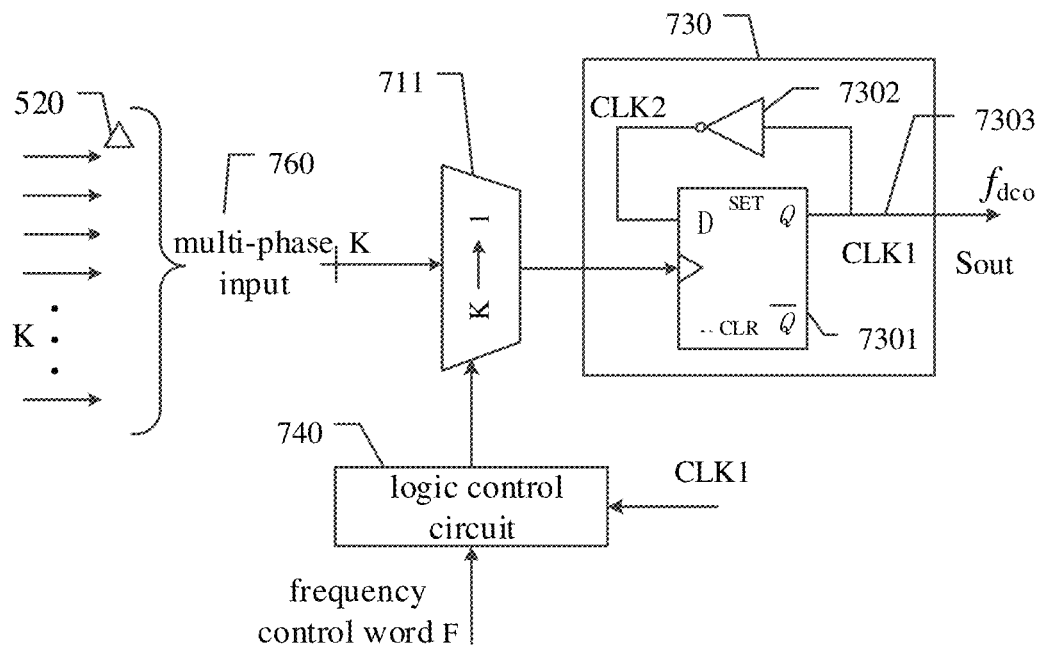
FIG. 11A is a structural schematic diagram of a frequency adjustment sub-circuit provided by an embodiment of the present disclosure.
Figure 11B:
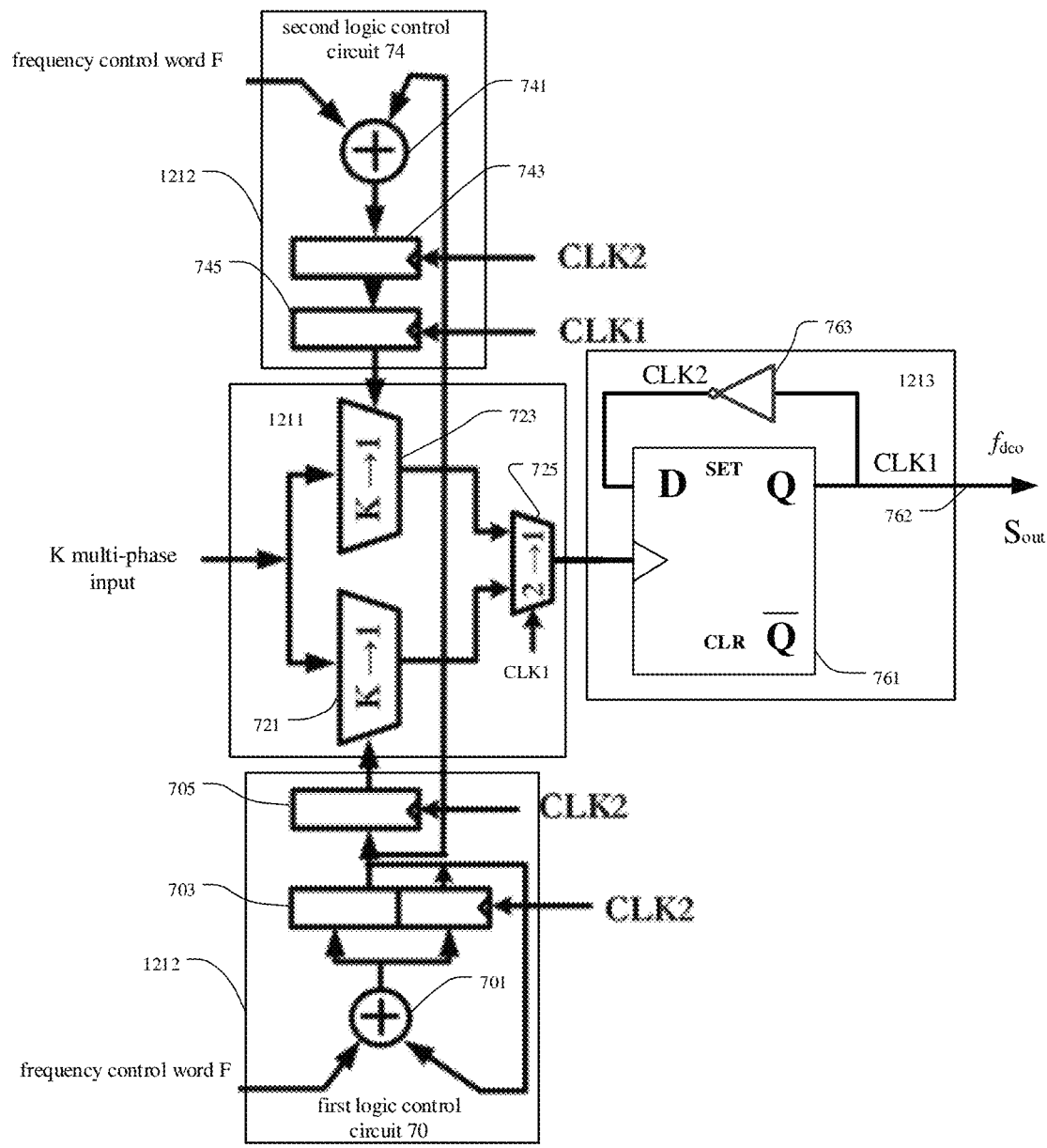
FIG. 11B is a structural schematic diagram of another frequency adjustment sub-circuit provided by an embodiment of the present disclosure.

FIG. 11A is a structural schematic diagram of a frequency adjustment sub-circuit provided by an embodiment of the present disclosure; and FIG. 11B is a structural schematic diagram of another frequency adjustment sub-circuit provided by an embodiment of the present disclosure.

Next, the circuit structure of the TAF-DPS synthesizer will be described with reference to FIGS. 11A and 11B.

For example, as shown in FIG. 11A, in an embodiment, the first input module 1211 includes a K→1 multiplexer 711. The K→1 multiplexer 711 has a plurality of input terminals, a control input terminal, and an output terminal for receiving the K reference output signals with phases evenly spaced.

For example, the output module 1213 includes a trigger circuit 730. The trigger circuit 730 is used to generate a pulse string. In the present disclosure, in a case where r is 0, the pulse string includes, for example, a pulse signal of the first period TA. The trigger circuit 730 includes a D flip-flop 7301, an inverter 7302, and an output terminal 7303. The D flip-flop 7301 includes a data input terminal, a clock input terminal for receiving an output from an output terminal of the K→1 multiplexer 711, and an output terminal for outputting the first clock signal CLK1. The inverter 7302 includes an inverter input terminal for receiving the first clock signal CLK1 and an inverter output terminal for outputting the second clock signal CLK2. The output terminal 7303 of the trigger circuit 730 is used to output the first clock signal CLK1 as the output signal $S_{out}$ having the target frequency $f_{dco}$.

For example, the first clock signal CLK1 includes the pulse string. The second clock signal CLK2 is connected to the data input terminal of the D flip-flop 7301.

For example, the second input module 1212 includes a logic control circuit 740. The logic control circuit 740 includes an input terminal for receiving the frequency control word F output from the control circuit 11, a clock input terminal for receiving the first clock signal CLK1, and an output terminal connected to an control input terminal of the K→1 multiplexer of the first input module 1211.

For example, as shown in FIG. 11B, in another embodiment, the first input module 1211 includes a first K→1 multiplexer 721, a second K→1 multiplexer 723, and a 2→1 multiplexer 725. Each of the first K→1 multiplexer 721 and the second K→1 multiplexer 723 includes a plurality of input terminals for receiving the K signals with phases evenly spaced, a control input terminal, and an output terminal. The 2→1 multiplexer 725 includes a control input terminal, an output terminal, a first input terminal for receiving an output of the first K→1 multiplexer 721, and a second input terminal for receiving an output of the second K→1 multiplexer 723.

For example, as shown in FIG. 11B, the output module 1213 includes a trigger circuit. The trigger circuit is used to generate a pulse string. The trigger circuit includes a D flip-flop 761, an inverter 763, and an output terminal 762. The D flip-flop 761 includes a data input terminal, a clock input terminal for receiving an output from an output terminal of the 2→1 multiplexer 725, and an output terminal for outputting the first clock signal CLK1. The inverter 763 includes an input terminal for receiving the first clock signal CLK1 and an output terminal for outputting the second clock signal CLK2. The output terminal 762 of the trigger circuit is used to output the first clock signal CLK1 as the output signal $S_{out}$ having the target frequency $f_{dco}$.

For example, the first clock signal CLK1 is connected to the control input terminal of the 2→1 multiplexer 725, and the second clock signal CLK2 is connected to the data input terminal of the D flip-flop 761.

For example, as shown in FIG. 11B, the second input module 1212 includes a first logic control circuit 70 and a second logic control circuit 74. The first logic control circuit 70 includes a first adder 701, a first register 703, and a second register 705. The second logic control circuit 74 includes a second adder 741, a third register 743, and a fourth register 745.

The first adder 701 adds the frequency control word (F) and the most significant bits (for example, 5 bits) stored in the first register 703, and then stores the addition result in the first register 703 at a rising edge of the second clock signal CLK2; alternatively, the first adder 701 adds the frequency control word (F) and all information stored in the first register 703, and then stores the addition result in the first register 703 at the rising edge of the second clock signal CLK2. At a rising edge of a next second clock signal CLK2, the most significant bit stored in the first register 703 will be stored in the second register 705 and serves as s selection signal of the first K→1 multiplexer 721 for selecting one of the K multi-phase input signals as a first output signal of the first K→1 multiplexer 721.

The second adder 741 adds the frequency control word (F) and the most significant bit stored in the first register 703, and then stores the addition result in the third register 743 at the rising edge of the second clock signal CLK2. At a rising edge of a next first clock signal CLK1, the information stored in the third register 743 will be stored in the fourth register 745 and used as a selection signal of the second K→1 multiplexer 723 for selecting one of the K multi-phase input signals as a second output signal of the second K→1 multiplexer 723.

At a rising edge of the first clock signal CLK1, the 2→1 multiplexer 725 selects one of the first output signal output from the first K→1 multiplexer 721 and the second output signal output from the second K→1 multiplexer 723 as the output signal of the 2→1 multiplexer 725, and the output signal of the 2→1 multiplexer 725 serves as the input clock signal of the D flip-flop 761.

For example, a period ($T_{dco}$) of the output signal $S_{out}$ output by the TAF-DPS synthesizer as shown in FIGS. 11A and 11B can be calculated by the above formula (1). For example, the frequency control word is set in the form of F=I+r, where I is an integer in the range of [2, 2K], and r is zero.

In addition, the working principle of TAF-DPS may refer to literatures, such as L. XIU, "Nanometer Frequency Synthesis beyond the Phase-Locked Loop", Piscataway, N.J. 08854, USA, John Wiley IEEE-press, 2012 and L. XIU, "From Frequency to Time-Average-Frequency: a Paradigm Shift in the Design of Electronic System", Piscataway, N.J. 08854, USA, John Wiley IEEE-press, 2015. The entire contents of the literatures are hereby incorporated by reference.

For example, as shown in FIGS. 2 and 6, in some embodiments, the frequency locked loop 10 further includes the first frequency division circuit 13. The first frequency division circuit 13 is configured to generate the feedback frequency $f_b$ based on the target frequency $f_{dco}$ and input the feedback signal having the feedback frequency $f_b$ to the control circuit 11.

For example, the frequency division coefficient of the first frequency division circuit 13 may be N, so that the feedback frequency $f_b$ is expressed as:

$$f_b = f_{dco}/N,$$

where $f_b$ represents the feedback frequency, $f_{dco}$ represents the target frequency, N represents the frequency division coefficient of the first frequency division circuit 13, and N is a positive integer.

For example, in some examples, the input frequency $f_i$ may be exactly equal to a certain feedback frequency $f_b$, and at this time, a relationship between the input frequency $f_i$ and the frequency control word F may be expressed as:

$$f_i = \frac{f_\Delta}{F \cdot N} \tag{2}$$

where $f_\Delta$ represents the frequency of the base time unit.

For example, based on the above relationship expression (2), the frequency control word F can be expressed as:

$$F = f_{66}/(f_i \cdot N)$$

From this, it can be seen that the frequency control word F is also related to the frequency $f_\Delta$ of the base time unit. As shown in FIG. 6, the base time unit generation sub-circuit 120 is further configured to output the base time unit Δ to the signal generation sub-circuit 112.

For example, in other examples, the input frequency $f_i$ is not completely equal to any feedback frequency $f_b$, and the frequency locked loop provided by the embodiments of the present disclosure can generate an arbitrary input frequency by two frequencies according to the concept of average-time-frequency. At this time, the relationship between the input frequency $f_i$ and the frequency control word F can be expressed as:

$$f_i = p \cdot f_1 + q \cdot f_2 = p \cdot \frac{f_\Delta}{F \cdot N} + q \cdot \frac{f_\Delta}{N \cdot (F+1)} \quad (3)$$

where $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word. For example, $f_1$ represents the first feedback frequency, $f_2$ represents the second feedback frequency, p represents a probability of occurrence of the first feedback frequency $f_1$, and q represents a probability of occurrence of the second feedback frequency $f_2$. Therefore, according to the above relationship expression (3), finally, the frequency control word F will oscillate between two integers and furthermore, a locked state is entered.

Figure 12:
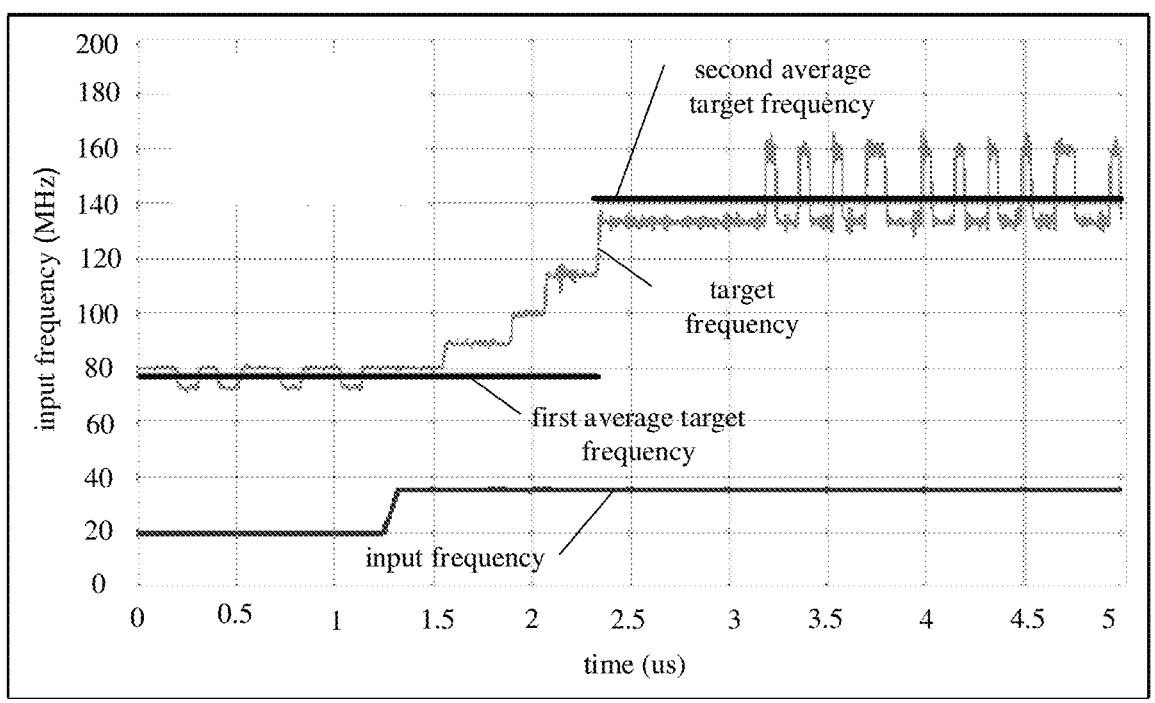
FIG. 12 is a schematic diagram of frequency tracking characteristics of a frequency locked loop provided by an embodiment of the present disclosure.

FIG. 12 is a schematic diagram of frequency tracking characteristics of a frequency locked loop provided by an embodiment of the present disclosure. As shown in FIG. 12, in a case where the input frequency $f_i$ is a certain fixed value (e.g., 20 MHz), the target frequency $f_{dco}$ of the output of the frequency locked loop 10 oscillates between a first frequency value and a second frequency value (e.g., both the first frequency value and the second frequency value are fixed values), and the frequency locked loop 10 locks the target frequency of the output, in this case, a first average target frequency of the output signal output by the frequency locked loop 10 can be obtained based on the first frequency value and the second frequency value; and in a case where the input frequency $f_i$ suddenly changes (e.g., the input frequency $f_i$ becomes 38 MHz), the frequency locked loop 10 responds quickly and reaches the locked state again after a short time. At this time, the target frequency $f_{dco}$ of the output of the frequency locked loop 10 oscillates between a third frequency value and a fourth frequency value (e.g., both the third frequency value and the fourth frequency value are fixed values), and in this case, a second average target frequency of the output signal output by the frequency locked loop 10 can be obtained based on the third frequency value and the fourth frequency value. As can be seen from FIG. 12, in the locked state, the target frequency output by the frequency locked loop 10 oscillates back and forth between two frequencies to achieve the average frequency. For example, an actual test result of the accuracy of the frequency locked loop 10 provided by the embodiments of the present disclosure can be as high as 0.0125 ppb.

Figure 13:
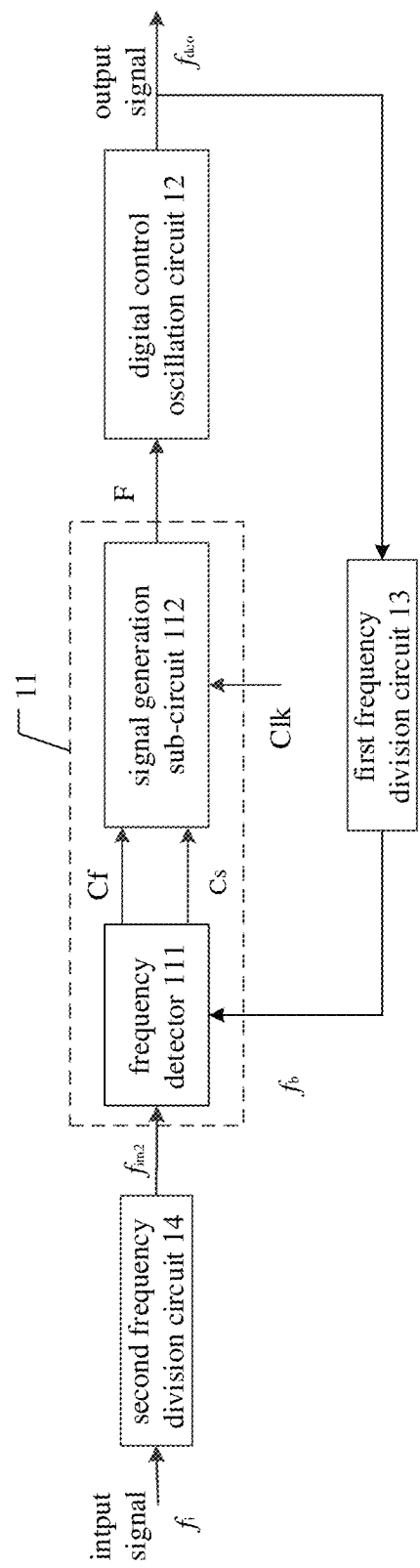
FIG. 13 is a schematic diagram of a circuit structure of another frequency locked loop provided by an embodiment of the present disclosure.

FIG. 13 is a schematic diagram of a circuit structure of another frequency locked loop according to an embodiment of the present disclosure.

For example, the decimal frequency locked loop is a design difficulty in the current frequency locked loop field, but in the frequency locked loop provided by the embodiments of the present disclosure, the number of the decimal places can be relatively high. For example, in other embodiments, as shown in FIG. 13, the frequency locked loop 10 further includes a first frequency division circuit 13 and a second frequency division circuit 14. For example, the first frequency division circuit 13 is configured to generate a feedback frequency based on the target frequency and input a feedback signal having the feedback frequency to the control circuit. The second frequency division circuit 14 is configured to perform frequency division on the input frequency to generate a second intermediate frequency and input a second intermediate signal having the second intermediate frequency to the control circuit 11.

For example, the feedback frequency $f_b$ can be expressed as:

$$f_b = f_{dco}/P,$$

where $f_{dco}$ represents the target frequency, P represents the first frequency division coefficient of the first frequency division circuit 13, P is a positive integer. It should be noted that the structure, parameters (e.g., the first frequency division coefficient P and so on), and the like of the first frequency division circuit 13 in the embodiment as shown in FIG. 13 may be the same as or different from the structure, parameters (e.g., the first frequency division coefficient N and so on), and the like of the first frequency division circuit 13 in the embodiment as shown in FIG. 2, for example, N may or may not be equal to P. The present disclosure is not specifically limited thereto.

For example, the second intermediate frequency $f_{im2}$ is expressed as:

$$f_{im2} = f_i/D,$$

where $f_i$ represents the input frequency, D represents the second frequency division coefficient of the second frequency division circuit 14, D is a positive integer, and P is greater than or equal to D.

For example, the frequency locked loop provided by the embodiment as shown in FIG. 2 can achieve integer frequency multiplication, and the frequency locked loop provided by the embodiment as shown in FIG. 13 can achieve frequency multiplication or frequency division of any value. In some examples, in order to keep the accuracy of the outputted target frequency still at the ppb level, the frequency locked loop uses 0.0078125(1/128) as the decimal resolution.

It should be noted that, except for performing frequency division on the input frequency by the second frequency division circuit 14, the structure and function of the remaining circuits in the frequency locked loop provided by the embodiment as shown in FIG. 13 are the same as the structure and function of the circuits in the frequency locked loop as shown in FIG. 2, and will not be described here again.

For example, in some examples, the input frequency $f_i$ may be exactly equal to a certain feedback frequency $f_b$, and in this case, the relationship between the input frequency $f_i$ and the frequency control word is expressed as:

$$f_i = \frac{f_\Delta \cdot D}{F \cdot P},$$

where $f_\Delta$ represents the frequency of the base time unit, and F represents the frequency control word.

For example, in other examples, the input frequency $f_i$ is not completely equal to any feedback frequency $f_b$, and the frequency locked loop provided by the embodiments of the present disclosure can generate an arbitrary input frequency by two frequencies according to the concept of average-time-frequency. In this case, the relationship between the input frequency $f_i$ and the frequency control word is expressed as:

$$f_i = p \cdot f_1 + q \cdot f_2 = p \cdot \frac{f_\Delta \cdot D}{F \cdot N} + q \cdot \frac{f_\Delta \cdot D}{(F+1) \cdot P}$$

where, $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word.

Figure 14:
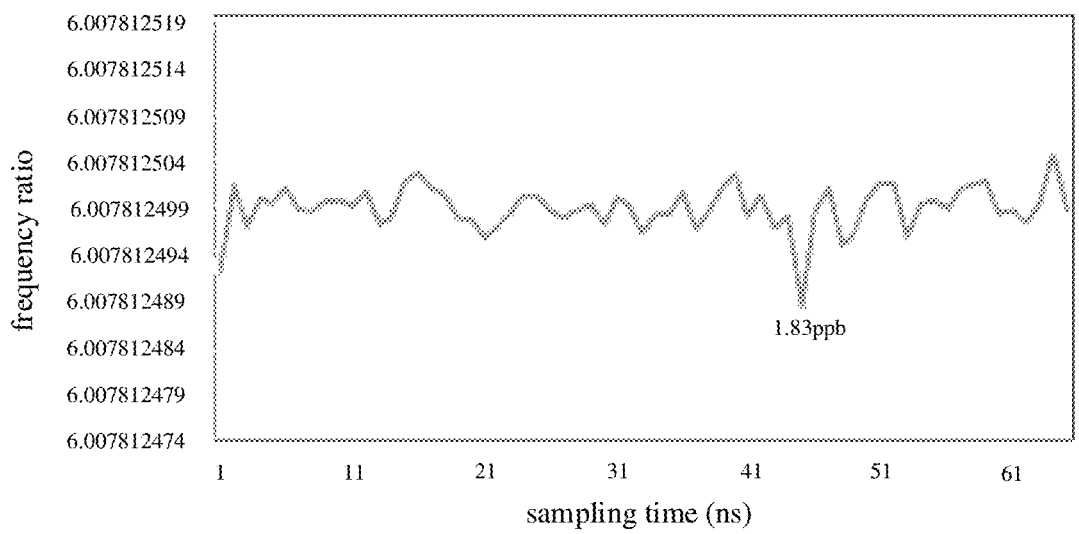
FIG. 14 is a test diagram of a frequency ratio of a frequency locked loop provided by an embodiment of the present disclosure.

FIG. 14 is a test diagram of a frequency ratio of a frequency locked loop according to an embodiment of the present disclosure. As shown in FIG. 14, the abscissa represents the sampling time, and a unit of the sampling time is nanoseconds (ns), and the ordinate represents the frequency ratio between the target frequency and the input frequency. As can be seen from FIG. 14, the frequency ratio between the target frequency and the input frequency is in a range of 1.83 ppb, and the accuracy is high. From this, it can be seen that the frequency locked loop provided by the embodiment of the present disclosure can still maintain high precision in a case where the fractional resolution reaches 0.0078125.

Figure 15:
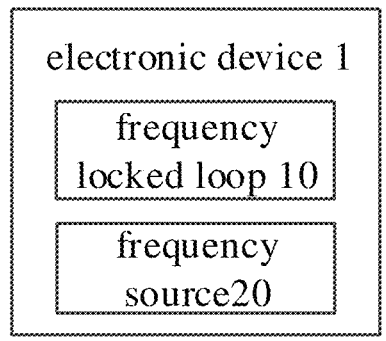
FIG. 15 is a schematic block diagram of an electronic device provided by an embodiment of the present disclosure.

At least one embodiment of the present disclosure also provides an electronic device. FIG. 15 is a schematic block diagram of an electronic device provided by an embodiment of the present disclosure.

For example, as shown in FIG. 15, the electronic device 1 provided by the embodiment of the present disclosure may include a frequency source 20 and the frequency locked loop 10 according to any one of the above embodiments of the present disclosure.

For example, the frequency source 20 is configured to provide an input signal having the input frequency and transmit the input signal to the frequency locked loop 10.

For example, the frequency source 20 may include a self-excited oscillation source and a synthetic frequency source. The self-excited oscillation source includes a crystal oscillator, a cavity oscillator, a voltage controlled oscillator, and the like. The synthetic frequency source includes a direct analog frequency source, a direct digital frequency source, an indirect analog frequency source, and an indirect digital frequency source.

It should be noted that the detailed description of the frequency locked loop can refer to the relevant description in the above-mentioned embodiments of the frequency locked loop and will not be repeated here again.

Figure 16:
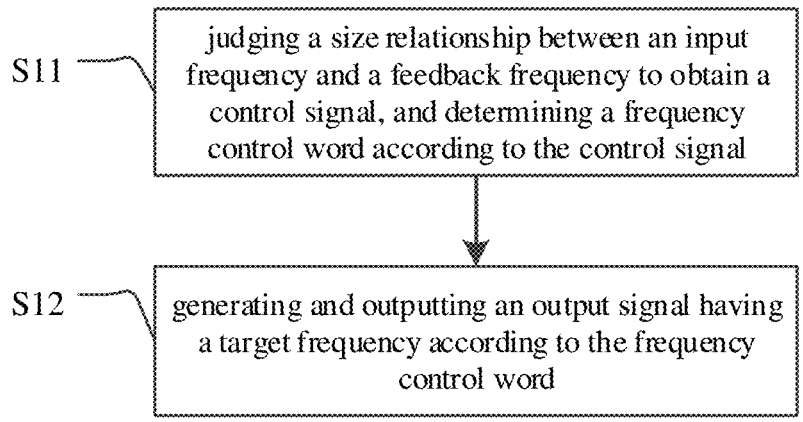
FIG. 16 is a schematic flow chart of a frequency generation method provided by an embodiment of the present disclosure.

At least one embodiment of the present disclosure also provides a frequency generation method. FIG. 16 is a schematic flow chart of a frequency generation method provided by an embodiment of the present disclosure. The frequency generation method provided by the embodiments of the present disclosure can be implemented based on the frequency locked loop described in any one of the embodiments of the present disclosure.

For example, as shown in FIG. 16, the frequency generation method provided by the embodiments of the present disclosure may include the following operations:

S11: judging a size relationship between an input frequency and a feedback frequency to obtain a control signal, and determining a frequency control word according to the control signal;

S12: generating and outputting an output signal having a target frequency according to the frequency control word.

For example, in step S11, the control signal includes a first sub-control signal and a second sub-control signal. The step of judging the size relationship between the input frequency and the feedback frequency to obtain the control signal may include: generating the first sub-control signal in a case where the input frequency is greater than the feedback frequency, and generating the second sub-control signal that is different from the first sub-control signal in a case where the input frequency is less than the feedback frequency.

The frequency generation method provided by the embodiments of the present disclosure controls to generate the frequency control word according to the size between the input frequency and the feedback frequency, and then generates the target frequency according to the frequency control word. The input frequency can be any value and does not need to correspond to the target frequency. The frequency generation method has the characteristics, such as high precision, fast response speed, low power consumption, small volume, programmability, etc.

For example, in step S11, the operation of determining the frequency control word according to the control signal may include the following operations:

according to the first sub-control signal, subtracting a first adjustment parameter from a frequency control word to be adjusted to generate the frequency control word; or, according to the second sub-control signal, adding a second adjustment parameter to the frequency control word to be adjusted to generate the frequency control word.

For example, the first adjustment parameter and the second adjustment parameter are the same, and are both 1, for example.

For example, in step S12, the output signal having the target frequency may be generated by a TAF-DPS synthesizer.

It should be noted that, for the description of the frequency generation method, reference may be made to the description of the frequency locked loop above. For example, step S11 can be implemented by the control circuit in the frequency locked loop according to any one of the embodiments of the present disclosure, and step S12 can be implemented by the digital control oscillation circuit in the frequency locked loop according to any one of the embodiments of the present disclosure, and similar operations or steps will not be repeated here again.

For the present disclosure, the following points need to be explained:

(1) The drawings of the embodiments of the present disclosure only refer to the structures related to the embodiments of the present disclosure, and other structures may refer to the general design.

(2) In case of no conflict, the embodiments of the present disclosure and the features in the embodiments can be combined with each other to obtain new embodiments.

What have been described above merely are exemplary embodiments of the present disclosure, and not intended to define the scope of the present disclosure, and the scope of the present disclosure is determined by the appended claims.

What is claimed is:

1. A frequency locked loop, comprising:
a control circuit, configured to judge a size relationship between an input frequency and a feedback frequency to obtain a control signal, and determine a frequency control word according to the control signal, wherein the control signal comprises a first sub-control signal and a second sub-control signal, the control circuit is configured to generate the first sub-control signal in a case where the input frequency is greater than the feedback frequency, and the control circuit is configured to generate the second sub-control signal that is different from the first sub-control signal in a case where the input frequency is less than the feedback frequency; and a digital control oscillation circuit, configured to generate and output an output signal having a target frequency according to the frequency control word;

wherein the control circuit comprises a frequency detector, the frequency detector is configured to judge the size relationship between the input frequency and the feedback frequency to obtain the control signal, the frequency detector is configured to generate and output the first sub-control signal in a case where the input frequency is greater than the feedback frequency, and the frequency detector is configured to generate and output the second sub-control signal in a case where the input frequency is less than the feedback frequency;

the frequency detector comprises a first circuit, a second circuit, and a third frequency division circuit, wherein a feedback period of a feedback signal having the feedback frequency comprises a first edge, a second edge, and a third edge, the second edge is between the first edge and the third edge, the third frequency division circuit is configured to receive an input signal having the input frequency and perform frequency division on the input signal to obtain a first intermediate signal having a first intermediate frequency;

the first circuit is configured to receive the feedback signal and the first intermediate signal, and judge and output a first logic value of the first edge, a second logic value of the second edge, and a third logic value of the third edge; and the second circuit is configured to generate and output the first sub-control signal or the second sub-control signal according to the first logic value, the second logic value, and the third logic value.

2. The frequency locked loop according to claim 1, wherein the control circuit further comprises a signal generation sub-circuit, the signal generation sub-circuit is configured to generate the frequency control word according to the control signal and output the frequency control word to the digital control oscillation circuit under control of a clock signal, wherein the clock signal is the output signal or the feedback signal having the feedback frequency.

3. The frequency locked loop according to claim 2, wherein the signal generation sub-circuit is configured to, according to the first sub-control signal, subtract a first adjustment parameter from a frequency control word to be adjusted to generate the frequency control word; or the signal generation sub-circuit is configured to, according to the second sub-control signal, add a second adjustment parameter to the frequency control word to be adjusted to generate the frequency control word.

4. The frequency locked loop according to claim 2, wherein the signal generation sub-circuit comprises an operation module and a storage module, the operation module is configured to, according to the first sub-control signal, subtract a first adjustment parameter from a frequency control word to be adjusted to generate the frequency control word, or the operation module is configured to, according to the second sub-control signal, add a second adjustment parameter to the frequency control word to be adjusted to generate the frequency control word; and the storage module is configured to store the frequency control word to be adjusted and the frequency control word.

5. The frequency locked loop according to claim 1, wherein a third frequency division coefficient of the third frequency division circuit is 2, the first circuit comprises a first D flip-flop, a second D flip-flop, a third D flip-flop, a fourth D flip-flop, and a first NOT gate, and the second circuit comprises a first XOR gate, a second XOR gate, a second NOT gate, a third NOT gate, a first AND gate, and a second AND gate, a data input terminal of the first D flip-flop is configured to receive the first intermediate signal, a clock input terminal of the first D flip-flop is configured to receive the feedback signal, an output terminal of the first D flip-flop is connected to a data input terminal of the second D flip-flop and a first data input terminal of the first XOR gate, and the output terminal of the first D flip-flop is configured to output the first logic value;

a clock input terminal of the second D flip-flop is configured to receive the feedback signal, an output terminal of the second D flip-flop is connected to a first data input terminal of the second XOR gate, and the output terminal of the second D flip-flop is configured to output the third logic value;

the first NOT gate is configured to receive the feedback signal and invert the feedback signal to obtain an intermediate feedback signal;

a data input terminal of the third D flip-flop is configured to receive the first intermediate signal, a clock input terminal of the third D flip-flop is configured to receive the intermediate feedback signal, and an output terminal of the third D flip-flop is connected to a data input terminal of the fourth D flip-flop;

a clock input terminal of the fourth D flip-flop is configured to receive the feedback signal, an output terminal of the fourth D flip-flop is connected to a second data input terminal of the first XOR gate and a second data input terminal of the second XOR gate, and the output terminal of the fourth D flip-flop is configured to output the second logic value;

an output terminal of the first XOR gate is connected to an input terminal of the second NOT gate and a first data input terminal of the first AND gate;

an output terminal of the second XOR gate is connected to an input terminal of the third NOT gate and a second data input terminal of the first AND gate;

an output terminal of the second NOT gate is connected to a first data input terminal of the second AND gate, and an output terminal of the third NOT gate is connected to a second data input terminal of the second AND gate; and an output terminal of the first AND gate is configured to output the first sub-control signal, and an output terminal of the second AND gate is configured to output the second sub-control signal.

6. The frequency locked loop according to claim 3, wherein the frequency control word is a positive integer.

7. The frequency locked loop according to claim 6, wherein the first adjustment parameter and the second adjustment parameter are both 1.

8. The frequency locked loop according to claim 2, further comprising a first frequency division circuit, wherein the first frequency division circuit is configured to generate the feedback frequency based on the target frequency and input the feedback signal having the feedback frequency to the control circuit, the feedback frequency is expressed as:

$$f_b = f_{dco}/N,$$

where $f_b$ represents the feedback frequency, $f_{dco}$ represents the target frequency, N represents a first frequency division coefficient of the first frequency division circuit, and N is a positive integer.

9. The frequency locked loop according to claim 8, wherein a relationship between the input frequency and the frequency control word is expressed as:

$$f_i = \frac{f_\Delta}{F \cdot N},$$

where $f_i$ represents the input frequency, $f_\Delta$ represents a frequency of a base time unit, and F represents the frequency control word; or, the relationship between the input frequency and the frequency control word is expressed as:

$$f_i = p \cdot f_1 + q \cdot f_2 = p \cdot \frac{f_\Delta}{F \cdot N} + q \cdot \frac{f_\Delta}{N \cdot (F+1)},$$

where, $f_i$ represents the input frequency, $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word.

10. The frequency locked loop according to claim 2, further comprising a first frequency division circuit and a second frequency division circuit, wherein the first frequency division circuit is configured to generate the feedback frequency based on the target frequency, and input the feedback signal having the feedback frequency to the control circuit, the second frequency division circuit is configured to perform frequency division on the input frequency to generate a second intermediate frequency, and input a second intermediate signal having the second intermediate frequency to the control circuit, the feedback frequency is expressed as:

$$f_b = f_{dco}/P,$$

where $f_b$ represents the feedback frequency, $f_{dco}$ represents the target frequency, P represents a first frequency division coefficient of the first frequency division circuit, P is a positive integer, and the second intermediate frequency is expressed as:

$$f_{im2} = f_i/D,$$

where $f_{im2}$ represents the second intermediate frequency, $f_i$ represents the input frequency, D represents a second frequency division coefficient of the second frequency division circuit, D is a positive integer, and P is greater than or equal to D.

11. The frequency locked loop according to claim 10, wherein a relationship between the input frequency and the frequency control word is expressed as:

$$f_i = \frac{f_\Delta \cdot D}{F \cdot P},$$

where $f_\Delta$ represents a frequency of a base time unit, and F represents the frequency control word; or, the relationship between the input frequency and the frequency control word is expressed as:

$$f_i = p \cdot f_1 + q \cdot f_2 = p \cdot \frac{f_\Delta \cdot D}{F \cdot N} + q \cdot \frac{f_\Delta \cdot D}{(F+1) \cdot P},$$

where $f_1$ and $f_2$ both represent the feedback frequency, p and q are coefficients, p represents a weight of $f_1$, q represents a weight of $f_2$, $f_\Delta$ represents the frequency of the base time unit, and F represents the frequency control word.

12. The frequency locked loop according to claim 1, wherein the digital control oscillation circuit comprises:
a base time unit generation sub-circuit, configured to generate and output a base time unit; and
a frequency adjustment sub-circuit, configured to generate and output the output signal having the target frequency according to the frequency control word and the base time unit.

13. An electronic device, comprising:
a frequency source, configured to provide an input signal having an input frequency; and
the frequency locked loop according to claim 1.

14. A frequency generation method based on a frequency locked loop, wherein the frequency locked loop comprises a control circuit and a digital control oscillation circuit,
the control circuit is configured to judge a size relationship between an input frequency and a feedback frequency to obtain a control signal, and determine a frequency control word according to the control signal, the control signal comprises a first sub-control signal and a second sub-control signal, the control circuit is configured to generate the first sub-control signal in a case where the input frequency is greater than the feedback frequency, and the control circuit is configured to generate the second sub-control signal that is different from the first sub-control signal in a case where the input frequency is less than the feedback frequency; and
the digital control oscillation circuit is configured to generate and output an output signal having a target frequency according to the frequency control word,
wherein the control circuit comprises a frequency detector,
the frequency detector is configured to judge the size relationship between the input frequency and the feedback frequency to obtain the control signal, the frequency detector is configured to generate and output the first sub-control signal in a case where the input frequency is greater than the feedback frequency, and the frequency detector is configured to generate and output the second sub-control signal in a case where the input frequency is less than the feedback frequency;
the frequency detector comprises a first circuit, a second circuit, and a third frequency division circuit,
wherein a feedback period of a feedback signal having the feedback frequency comprises a first edge, a second edge, and a third edge, the second edge is between the first edge and the third edge, the third frequency division circuit is configured to receive an input signal having the input frequency and perform frequency division on the input signal to obtain a first intermediate signal having a first intermediate frequency;

the first circuit is configured to receive the feedback signal and the first intermediate signal, and judge and output a first logic value of the first edge, a second logic value of the second edge, and a third logic value of the third edge; and the second circuit is configured to generate and output the first sub-control signal or the second sub-control signal according to the first logic value, the second logic value, and the third logic value;

the frequency generation method comprises:

judging the size relationship between the input frequency and the feedback frequency to obtain the control signal, and determining the frequency control word according to the control signal, wherein the control signal comprises the first sub-control signal and the second sub-control signal, the first sub-control signal is generated in a case where the input frequency is greater than the feedback frequency, and the second sub-control signal that is different from the first sub-control signal is generated in a case where the input frequency is less than the feedback frequency; and generating and outputting the output signal having the target frequency according to the frequency control word.

15. The frequency generation method according to claim 14, wherein determining the frequency control word according to the control signal comprises:

according to the first sub-control signal, subtracting a first adjustment parameter from a frequency control word to be adjusted to generate the frequency control word; or, according to the second sub-control signal, adding a second adjustment parameter to the frequency control word to be adjusted to generate the frequency control word.

16. The frequency locked loop according to claim 3, further comprising a first frequency division circuit, wherein the first frequency division circuit is configured to generate the feedback frequency based on the target frequency and input the feedback signal having the feedback frequency to the control circuit, the feedback frequency is expressed as:

$$f_b = f_{dco}/N,$$

where $f_b$ represents the feedback frequency, $f_{dco}$ represents the target frequency, N represents a first frequency division coefficient of the first frequency division circuit, and N is a positive integer.

17. The frequency locked loop according to claim 3, further comprising a first frequency division circuit and a second frequency division circuit, wherein the first frequency division circuit is configured to generate the feedback frequency based on the target frequency, and input the feedback signal having the feedback frequency to the control circuit, the second frequency division circuit is configured to perform frequency division on the input frequency to generate a second intermediate frequency, and input a second intermediate signal having the second intermediate frequency to the control circuit, the feedback frequency is expressed as:

$$f_b = f_{dco}/P,$$

where $f_b$ represents the feedback frequency, $f_{dco}$ represents the target frequency, P represents a first frequency division coefficient of the first frequency division circuit, P is a positive integer, and the second intermediate frequency is expressed as:

$$f_{im2} = f_i/D,$$

where $f_{im2}$ represents the second intermediate frequency, $f_i$ represents the input frequency, D represents a second frequency division coefficient of the second frequency division circuit, D is a positive integer, and P is greater than or equal to D.

18. A frequency locked loop, comprising:

a control circuit, configured to judge a size relationship between an input frequency and a feedback frequency to obtain a control signal, and determine a frequency control word according to the control signal, wherein the control signal comprises a first sub-control signal and a second sub-control signal, the control circuit is configured to generate the first sub-control signal in a case where the input frequency is greater than the feedback frequency, and the control circuit is configured to generate the second sub-control signal that is different from the first sub-control signal in a case where the input frequency is less than the feedback frequency;

a digital control oscillation circuit, configured to generate and output an output signal having a target frequency according to the frequency control word; and a first frequency division circuit, configured to generate the feedback frequency based on the target frequency and input the feedback signal having the feedback frequency to the control circuit, wherein the digital control oscillation circuit comprises:

a base time unit generation sub-circuit, configured to generate and output K reference output signals with phases evenly spaced and a base time unit; and a frequency adjustment sub-circuit, configured to generate and output the output signal having the target frequency according to the frequency control word and the base time unit, the base time unit is a time span between any two adjacent reference output signals of the K reference output signals, a relationship between the input frequency and the frequency control word is expressed as:

$$f_i = f_\Delta/F \cdot N,$$

where $f_i$ represents the input frequency, $f_\Delta$ represents a frequency of the base time unit, F represents the frequency control word, N represents a first frequency division coefficient of the first frequency division circuit, and N is a positive integer; or, the relationship between the input frequency and the frequency control word is expressed as:

$$f_i = p \cdot f_1 + q \cdot f_2 = p \cdot f_\Delta/F \cdot N + q f_\Delta/N \cdot (F+1),$$

where, $f_i$ represents the input frequency, $f_1$ and $f_2$ both represent the feedback frequency, p and q are coefficients, p represents a weight of $f_1$, q represents a weight of $f_2$, $f_\Delta$ represents the frequency of the base time unit, F represents the frequency control word, N represents a first frequency division coefficient of the first frequency division circuit, and N is a positive integer.

* * * * *